United States Patent
Kopanoglu et al.

(10) Patent No.: US 8,928,320 B2
(45) Date of Patent: Jan. 6, 2015

(54) METHOD AND APPARATUS FOR REDUCTION OF SPECIFIC ABSORPTION RATE (SAR) IN MAGNETIC RESONANCE DATA ACQUISITION

(76) Inventors: Emre Kopanoglu, Ankara (TR); Ergin Atalar, Ankara (TR)

( * ) Notice: Subject to any disclaimer, the term of this patent is extended or adjusted under 35 U.S.C. 154(b) by 469 days.

(21) Appl. No.: 13/425,910

(22) Filed: Mar. 21, 2012

(65) Prior Publication Data

US 2012/0249139 A1  Oct. 4, 2012

Related U.S. Application Data

(60) Provisional application No. 61/468,075, filed on Mar. 28, 2011.

(51) Int. Cl.
| | | |
|---|---|---|
| *G01V 3/00* | (2006.01) | |
| *G01R 33/483* | (2006.01) | |
| *G01R 33/28* | (2006.01) | |
| *G01R 33/565* | (2006.01) | |

(52) U.S. Cl.
CPC .......... *G01R 33/4833* (2013.01); *G01R 33/288* (2013.01); *G01R 33/5659* (2013.01)

USPC .......................................... 324/314; 324/312

(58) Field of Classification Search
CPC ..................................................... G01R 33/288
USPC .................. 324/314, 312, 309, 307, 306, 300
See application file for complete search history.

(56) References Cited

U.S. PATENT DOCUMENTS

| | | | |
|---|---|---|---|
| 7,282,914 B2 * | 10/2007 | Morich et al. | 324/318 |
| 7,309,986 B2 * | 12/2007 | Epstein et al. | 324/309 |
| 8,686,726 B2 * | 4/2014 | Katscher et al. | 324/307 |

* cited by examiner

*Primary Examiner* — Louis Arana
(74) *Attorney, Agent, or Firm* — Schiff Hardin LLP

(57) ABSTRACT

In the acquisition of magnetic resonance data from an examination subject according to a pulse sequence that causes radiation into the examination subject of a radiated radio frequency (RF) pulse having a frequency spectrum and a slice profile with a relationship therebetween, the examination subject is substantially simultaneously, with the radiated RF pulse, to a non-linear magnetic field that alters the relationship in the radiated RF pulse between the frequency spectrum and the slice profile. The alteration of this relationship can be used, for example, to reduce the specific absorption rate (SAR) of the examination subject during the acquisition of the magnetic resonance data.

21 Claims, 21 Drawing Sheets (b)

(a)

METHOD AND APPARATUS FOR REDUCTION OF SPECIFIC ABSORPTION RATE (SAR) IN MAGNETIC RESONANCE DATA ACQUISITION

RELATED APPLICATION

The present application claims the benefit of the filing date of Provisional Application No. 61/468,075, filed Mar. 28, 2011.

BACKGROUND OF THE INVENTION

1. Field of the Invention

The invention is related to magnetic resonance imaging methods of the type that employ RF transmission to excite nuclear spins only inside a portion of the object.

2. Description of the Prior Art

In magnetic resonance imaging (MRI), a radio-frequency (RF) signal is transmitted to the sample (examination subject) in order to excite proton spins inside the sample, in order to generate an MR signal. To encode this signal spatially, a group of gradient fields are used. Conventionally, these gradient fields have linear dependence on the spatial coordinates, x, y and z. Hence, their effects on the spins are linear, and the governing equations are Fourier transforms in MRI.

Depending on the time of application during a pulse sequence, the encoding schemes accomplished by the gradient fields are called slice selection, phase encoding and readout (or frequency encoding). It is known that for linear gradient fields, the slice profile (or, excitation profile) along the slice selection direction, is the Fourier transform of the RF pulse (Pauly J, Nishimura D, Macovski A, A k-Space Analysis of Small-Tip-Angle Excitation. J Magn Reson, 1989; 81:43:56). In most MRI experiments, it is desirable to excite the spins inside the sample so that they have a perfectly rectangular slice profile, i.e., exciting the spins only between two planes while not exciting the other spins. Therefore, because of the Fourier transform relation, most sequences use sinc-type RF pulse envelopes.

The specific absorption rate (SAR), which is one of the most important parameters of an MRI experiment, is the total absorbed power inside a sample, per certain mass of tissue. Regulations are given by the FDA and IRC for 1-gram, 10-gram, head, whole body and organ averaged (torso and extremities) power values. The total absorbed power inside a sample is proportional to the magnitude squared integral of the RF envelope. Therefore, sinc-type envelopes have higher SAR than smoother envelopes.

It has been shown that, without altering the slice profile, SAR of an RF envelope can be decreased using variable-rate selective excitation (VERSE), (Conolly S, Nishimura D, Macovski A, Variable-Rate Selective Excitation. J Magn Reson, 1988; 78:440-458). In conventional techniques, the gradient coils that produce the slice selection gradients are turned on (activated) during slice selection and turned off afterwards. However, with VERSE technique, the current waveform that feeds the gradient coils is made a function of time. This way, the RF envelope can be modified without changing the slice profile. However, because the gradient currents vary in time, the off-resonance effects become a function of time and cause blurring.

An alternative way to alter the relation between the slice profile and the RF envelope is to use nonlinear gradient fields. Although nonlinear gradient fields have been studied before (for example, Lee S Y, Cho Z H, Localized Volume Selection Technique Using an Additional Radial Gradient Coil. Magn Reson Med, 1989; 12:56-63), their effect on the slice profile has not been recognized. Hence, the usage of nonlinear gradients has remained to serve the purpose of phase and frequency encoding.

SUMMARY OF THE INVENTION

An object of the invention is to use nonlinear magnetic fields for slice selection to alter the one-to-one relation between the Fourier transform of the excitation RF pulse envelope and the slice profile in order to enable SAR reduction.

With the usage of nonlinear slice selection magnetic fields, the users have the ability to alter the RF pulse without altering the slice profile, or the ability to design the slice profile without the need to adjust the RF envelope accordingly, or the ability to design both the RF envelope and the slice profile simultaneously.

Another object of the invention is to use nonlinear slice selection magnetic fields to compensate for the inhomogeneities in the transmitted RF field distribution inside the volume of interest.

Another object of the invention is to use nonlinear slice selection magnetic fields to excite curved regions for curved slice imaging and reduction of total scan time.

DESCRIPTION OF THE PREFERRED EMBODIMENTS

Introduction

Figure 1:
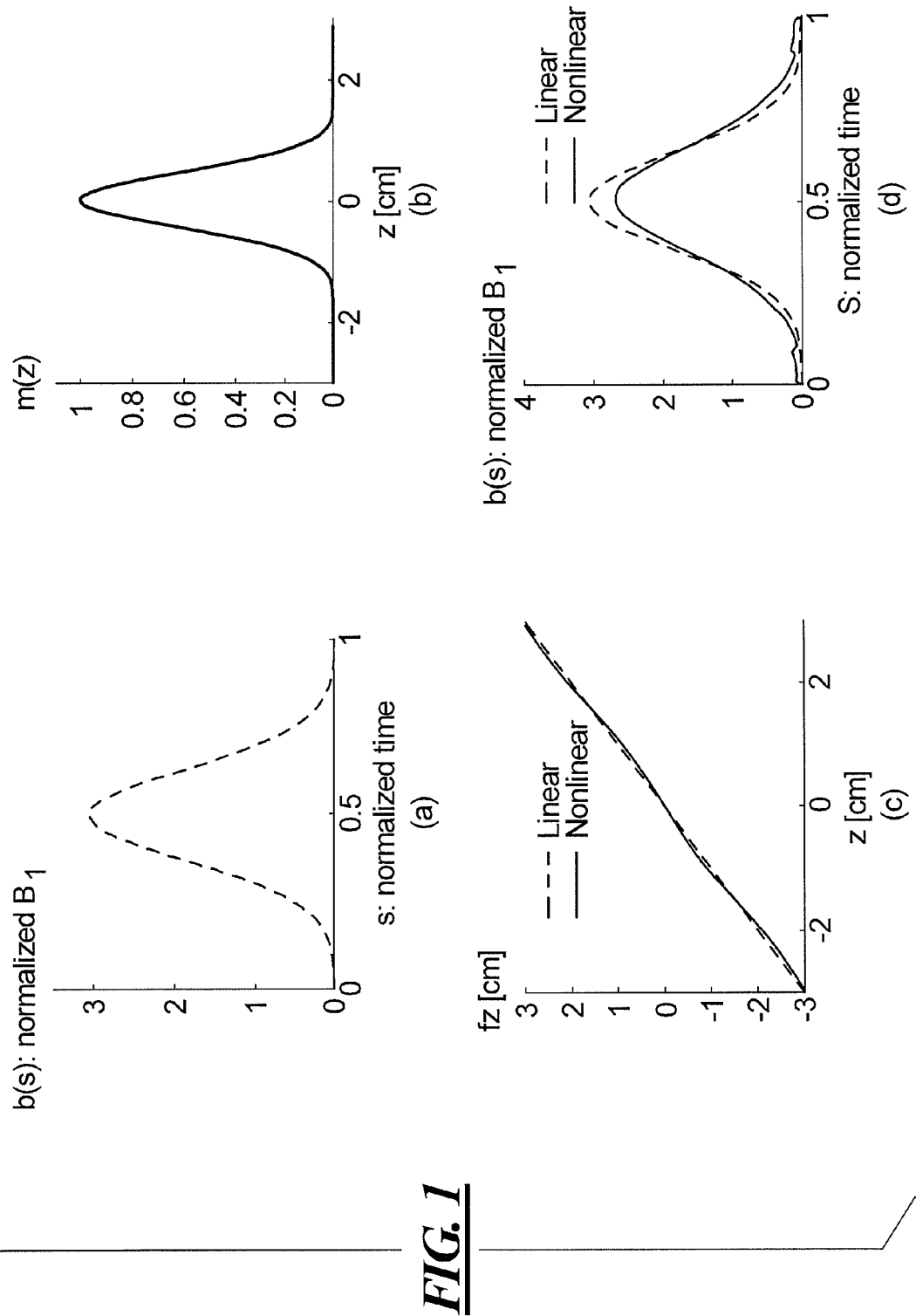
FIG. 1 show an example demonstrating the effect of using a nonlinear gradient field on a normalized RF pulse. a: An apodized sinc pulse that can be found in the Siemens RF pulse library is selected as the reference solution. b: The excitation profile of the apodized sinc pulse in the presence of a perfectly linear gradient field. c: The variation of the nonlinear field in space, compared with the linear gradient field. d: The RF pulse that obtains the desired excitation profile in the presence of the nonlinear gradient field is compared with the apodized sinc pulse.

In magnetic resonance imaging (MRI), gradient fields are used for altering the static magnetic field inside the volume of interest. Hence, except the transition intervals between the ON-OFF states of the gradient coils, the frequency of operation of gradient fields is zero. Therefore, as is known, the gradient fields should satisfy Laplace's equation, which is given as $\nabla^2 B=0$. Furthermore, it is known that if the Cartesian components of the magnetic field B are denoted by $B_x$, $B_y$ and $B_z$, then each component should separately satisfy Laplace's equation. This limits the one-dimensional field distributions that satisfy the Maxwell's Equations to linear distributions, i.e., $G_x x$, $G_y y$ and $G_z z$, which are the gradient fields of a conventional MRI scanner. As a consequence, higher order polynomial or nonlinear gradient field distributions that are functions of only one spatial variable cannot be achieved, i.e., for a field that is a nonlinear function of z, the physically realizable field will have a dependence on at least one of the remaining Cartesian coordinates x and y.

The present invention is based on the insight that SAR reduction can be achieved using nonlinear gradients. To facilitate understanding of this insight, three example studies are presented. In order to reduce the complexity, the first two examples are given for one dimensional object and the experiments are designed for thin tubular phantoms, such that inside the phantom, the x and y dependence of the field distributions can be neglected. In the third example, simulations and experiments on how the invention can be implemented for fields valid in a clinically applicable sized volume of interest are provided. Although the formulations will be given for the small tip angle regime (Pauly J, Nishimura D, Macovski A, A k-Space Analysis of Small-Tip-Angle Excitation. J Magn Reson, 1989; 81:43:56), the method is applicable at the large tip angle regime as well.

Theory

In this text, we will refer to the low frequency fields with nonlinear distributions in space as nonlinear gradient fields, to signify their respective roles in the encoding process. We will first assume that the object is one-dimensional for the sake of simplicity and then expand the number of dimensions.

It is known to those skilled in the art that the SAR depends on the duration and the flip angle of the RF envelope. Hence, when comparing different RF envelopes, the duration and flip angle should be the same. Therefore, we begin our formulation by defining normalized SAR, which is the SAR of an RF envelope that has a unit integral (constant flip angle) and unit duration as follows:

$$\text{nSAR} \triangleq \int_{-1/2}^{1/2} |b(s)|^2 ds \quad [1]$$

Where b(s) is the normalized RF envelope, which is defined as $$b(t/\tau) \triangleq \frac{\gamma \tau}{\alpha} B_1(t) \quad [2]$$

Where $\gamma$ is the gyromagnetic ratio, $B_1(t)$ is the envelope of the RF pulse, $\tau$ is the duration of the RE pulse and $\alpha$ is the flip angle of the RF envelope. The lowest possible value of nSAR is 1, which holds for a rectangular pulse.

We define the excitation profile as the transverse component of the excitation, normalized by the magnetization density, and denote this unitless quantity with m(z). When linear gradient fields are used for excitation, the Larmor frequency of the spins vary linearly in space, and the relation between the excitation profile and the RF envelope can be formulated as a Fourier transform (Pauly J, Nishimura D, Macovski A, A k-Space Analysis of Small-Tip-Angle Excitation. J Magn Reson, 1989; 81:43:56), as follows:

$$B_1(t) = -i\frac{G}{2\pi}M\left(\frac{\gamma Gt}{2\pi}\right) \quad [3]$$

Where i is the imaginary unit, G is the gradient fields strength, M(k) is the Fourier transform of the desired excitation profile, i.e., the excitation k-space, and $$k = \left(\frac{\gamma Gt}{2\pi}\right).$$

For practical reasons, RF pulses are truncated using apodizing functions. Since such a function is irrelevant to the presented idea, RF pulses are simply truncated to a duration of $\tau$, in this text.

When a linear gradient field is used in a one-dimensional space, there is a bijective relation between the observed field values and the positions in space. However, for certain nonlinear gradient fields such as a second order field, such a mapping may be nonbijective. Initially, we will assume that the field is bijective, and address nonbijective fields later in the text.

When a bijective nonlinear gradient field is used for excitation, the dependence of the RF envelope on the excitation k-space is altered. Assume that a nonlinear gradient field with field strength $G_w$ and field variation f(z) is used. By defining a nonlinear coordinate system w=f(z), the desired excitation profile can be expressed in terms of the nonlinear coordinate system as m(z)=m[f$^{-1}$(w)]=m$_n$(w). Then, the required RF envelope can be expressed in terms of the Fourier transform of m$_n$(w)., i.e., Mn(.) as follows:

$$B_{1n}(t) = -i\frac{G_w}{2\pi}M_n\left(\frac{\gamma G_w t}{2\pi}\right) \quad [4]$$

It should be noted that, the equations given above are for a one-dimensional object. When the desired excitation profile varies in three directions, multi-dimensional excitation pulses may be used. Although various approaches to multi-dimensional excitation pulses exist, we will give the derivations for only multi-spoke excitation scheme in this text. The formulations can be expanded to cover other schemes trivially by those skilled in the art. By denoting the desired excitation pattern with m(x) and its Fourier transform with M(k), where x=[x y z] and k=[k$_x$ k$_y$ k$_z$], the p$^{th}$ spoke of the RF pulse can be expressed as $$B_1^p(t) = -i\frac{G_z}{2\pi}M_n\left(k_x^p, k_y^p, \frac{\gamma G_w t}{2\pi}\right) \quad [5]$$

Where p indexes the spokes and the total duration of the RF envelope is $\Sigma_p\tau_p$ with $\tau_p$ being the duration of spoke p.

Similar to the one-dimensional case, assuming that the nonlinear field is bijective, a nonlinear coordinate system can be defined as u=[u v w]=f(x), where f(x) denotes the variation of the nonlinear field in space. Then, the desired excitation k-space can be expressed in the nonlinear coordinate system as m(x)=m[f$^{-1}$(u)]=m$_n$(u). By denoting the excitation k-space of m$_n$(u) as M$_n$(k$_n$), where k$_n$=[k$_u$, k$_v$, k$_w$] traces the excitation k-space, the RF envelope can be obtained as:

$$B_{1n}^p(t) = -i\frac{G_w}{2\pi}M_n\left(k_u^p, k_v^p, \frac{\gamma G_w t}{2\pi}\right) \quad [6]$$

As previously mentioned, some nonlinear gradient fields may be nonbijective. In this case, multiple positions in space will have the same field value. Therefore, the amount of excitation, i.e., flip angle, will be the same at such positions. Hence, care must be taken when using the above formulation. We will now identify such cases and suggest solutions i. When the desired flip angle distribution is compatible with the nonbijective gradient field, no special treatment is necessary. As an example, an excitation profile that is symmetric around z=0 can be obtained using a $z^2$ field.

ii. When the excitation profile is not compatible with the nonlinear field distribution, the field distribution can be modified to suit the excitation profile by using simultaneously with other field distributions. For example, an excitation profile that is symmetric around z=z$_0$ cannot be excited using a second order field. However, a $z^2-2zz_0$ field, which is compatible with the excitation profile, can be obtained by using a linear gradient field simultaneously with the nonlinear gradient field.

iii. If the above cases are not applicable, then the desired excitation profile can only be excited using the nonlinear gradient field. In this case, the residual part between the desired and the obtained excitation profiles can be realized using other, possibly linear gradient fields.

Therefore, even if the nonlinear field is nonbijective, it still can be used for excitation, when properly integrated with other field distributions.

When nonlinear gradient fields are used, the excitation k-space is modified. Since the normalized SAR (nSAR) and hence SAR are related to the excitation k-space through the RF envelope, this modification may increase or decrease the SAR. However, when linear and nonlinear gradient fields are used together, only the linear gradient fields may be used at the worst case scenario. Therefore, nonlinear gradient fields may only reduce the SAR.

As previously mentioned, the mapping between the positions in space and the field values may not be bijective, when nonlinear gradient fields are used. This concept introduces extra degrees of freedom to the pulse design process. Since some field values may never be observed in space, assigning certain flip angle values to the those field values may alter the corresponding excitation k-space, hence the RF pulse and the SAR. However, since those field values are never observed, the resulting excitation profile will not be altered. A possible formulation for this idea is as follows. Assume that in addition to the x, y, and z gradient fields, a nonlinear field with distribution w=$z^3-3/2z(x^2+y^2)$, which may be approximated as w=$x^2+y^2$, provided that the slice thickness along the z-axis is small, is also employed during excitation. Then, the desired excitation profile, m(x) can be expressed in terms of the four-dimensional nonlinear coordinate system (x;u)=[x y z u], as m(x;u), where the excitation profile may be nonzero for only positive values of u. Since any excitation value that is assigned to negative values of u will not map to the x-domain, by designing an alternative excitation profile m'(x;u), the excitation k-space and the RF pulse may be altered to reduce the SAR.

Materials and Methods

The effect of nonlinear gradient fields on the SAR is demonstrated with three example cases. To highlight the effect of nonlinear gradient fields on excitation and the SAR, the first two examples are one-dimensional. The third example is three-dimensional to demonstrate how a realistic case can be handled. Simulations are performed in Matlab (Mathworks, Natick, Mass., USA), whereas the experiments are performed using a 3T scanner (Magnetom Trio a Tim System, Siemens Healthcare, Erlangen, Germany). As a descriptor of excitation efficiency, the root mean squared error between the desired and the obtained excitation profiles is calculated, similar to (A. C. Zelinski, L. L. Wald, K. Setsompop, V. K. Goyal, and E. Adalsteinsson, "Sparsity-enforced slice-selective mri rf excitation pulse design.," *IEEE Trans Med Imaging*, vol. 27, pp. 1213-1229, September 2008.) The errors are reported as percentages with respect to the excitation level at the center of the ROI. The root mean squared (rms) error and the normalized SAR values will be reported in the results section.

Case 1) 1D: Pulse Design for a Given Nonlinear Field

In this example, the effect of a slight nonlinearity on the SAR is investigated using the field distribution given in FIG. 1c. An apodized sinc pulse (FIG. 1a) with no side lobes is used as the reference solution, which can be found in the Siemens RF pulse library. Using the excitation profile of the reference solution (FIG. 1b), the RF pulse for the nonlinear gradient field case is designed (FIG. 1d).

Figure 2B:
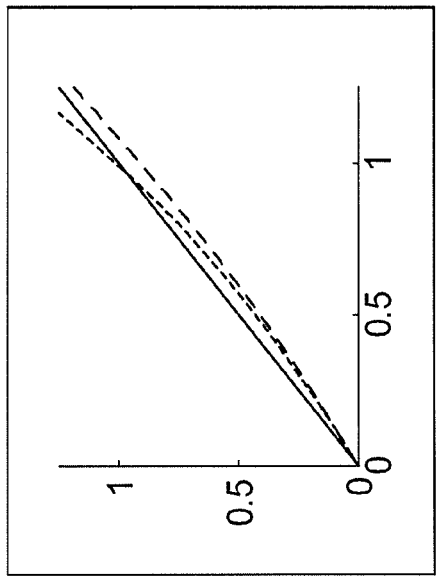
FIG. 2 shows a comparison of the simulated desired and realized fields and the produced gradient coil. a:The field obtained when the required current distribution is truncated to 6.4 cm along the z-direction is compared with the ideal and the linear fields (detail shown in b). c:The gradient coil is wound on a polyoxymethylene cylinder. The separation between the windings is 4 mm and total extent of the windings is 6.4 cm. The winding radius is 2.4 cm.
Figure 2A:
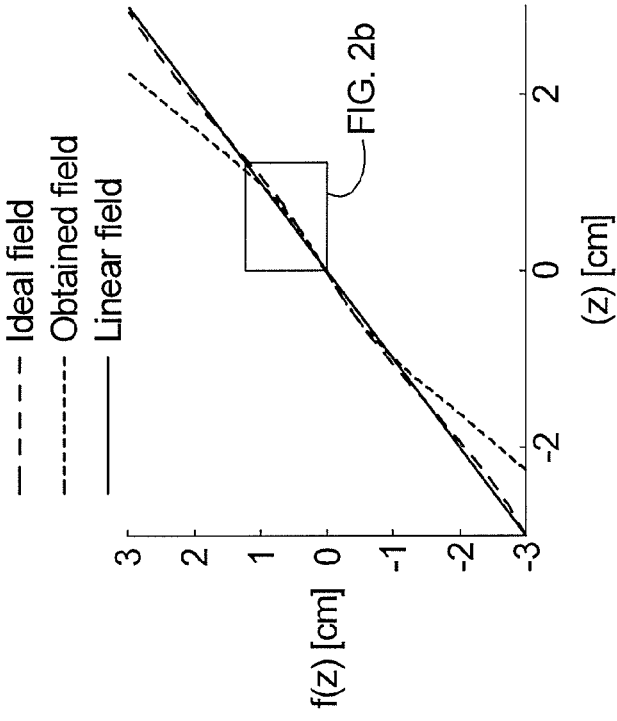
Figure 2C:
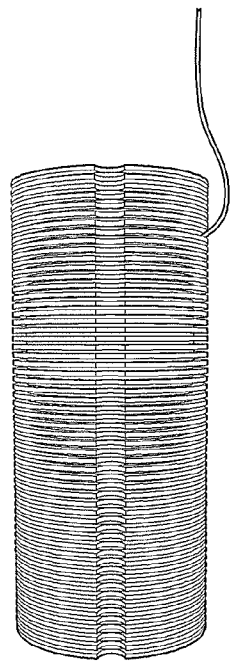

To realize the desired field experimentally, a gradient coil is designed. Using the target-field method (R. Turner, "A target field approach to optimal coil design," *J Phys D: Appl Phys*, vol. 19, pp. 147-151, 1986) the required current distribution along the z-axis is determined. The distribution is sampled at 4 mm intervals and truncated to a total length of 6.4 cm. The samples are then used to determine the number of turns along the z-axis. The corresponding field is simulated and given in FIG. 2a. Note that, although the simulated field deviates from the desired field due to the truncation, these deviations are outside the full-width-half-max (FWHM) of the desired excitation profile (FIG. 1b). Although the boundaries of the excitation region are expected to be slightly contracted due to the change in the slope of the field, the error is neglected since the amount of excitation outside the FWHM is low. Using the sampled current distribution, the coil is wound on a polyoxymethylene cylinder with a 2.4 cm radius (FIG. 2b).

In the experiments, a cylindrical phantom with a 1.4 cm radius, filled with water, is used. To observe the excitation profile, readout encoding is performed parallel to the excitation direction. Because the phantom is narrow in both x- and y-directions, encoding along the transverse plane is not required. Therefore, the x-channel is used for operating the custom gradient coil. For this purpose, a gradient signal monitoring system is produced that reads the gradient signal from the digital-to-analog converter (DAC) cards of the scanner hardware, converts the waveform to an optical signal outside the scanner room and then converts it back to an electrical waveform inside the room for isolation purposes. Then, the waveform is amplified using an audio amplifier and fed to the custom coil. To keep the x-gradient off, the amplifier of the x-gradient is disconnected from the DAC board. Typically, all linear gradient fields are used for shimming the magnetic field inside. Although the disconnection of the x-gradient coil signifies that the shimming is not perfect, the effect of the intra-voxel signal cancelation was negligible. This was because the phantom is narrow along the x-direction.

In the experiments, a gradient echo sequence with the following parameters is used: $\tau=1.25$ ms, TR=9.1 ms, TE=4.9 ms, $G_z=G_w=7.4$ mT/m, $FOV_z=116$ mm and the number of voxels along the z-direction=256.

Case 2) 1D: Field Design for Optimal SAR Pulses

Although the rectangular pulses are optimal in terms of the normalized SAR, they are not widely used because the excitation profile of a rectangular pulse in the presence of a linear gradient field is not sufficiently selective due to the sinc variation in space. It is known that by changing the slope of the gradient field, the excitation profile can be contracted or expanded. Therefore, by designing a field with a low slope in the center of the excitation region and high slopes at the boundaries, the main lobe of the excitation profile of a rectangular pulse can be expanded, whereas its side lobes can be contracted, yielding a selective excitation profile. Therefore, a nonlinear gradient field is designed in this example such that the excitation profile of a rectangular pulse is transformed into a selective one.

Figure 3:
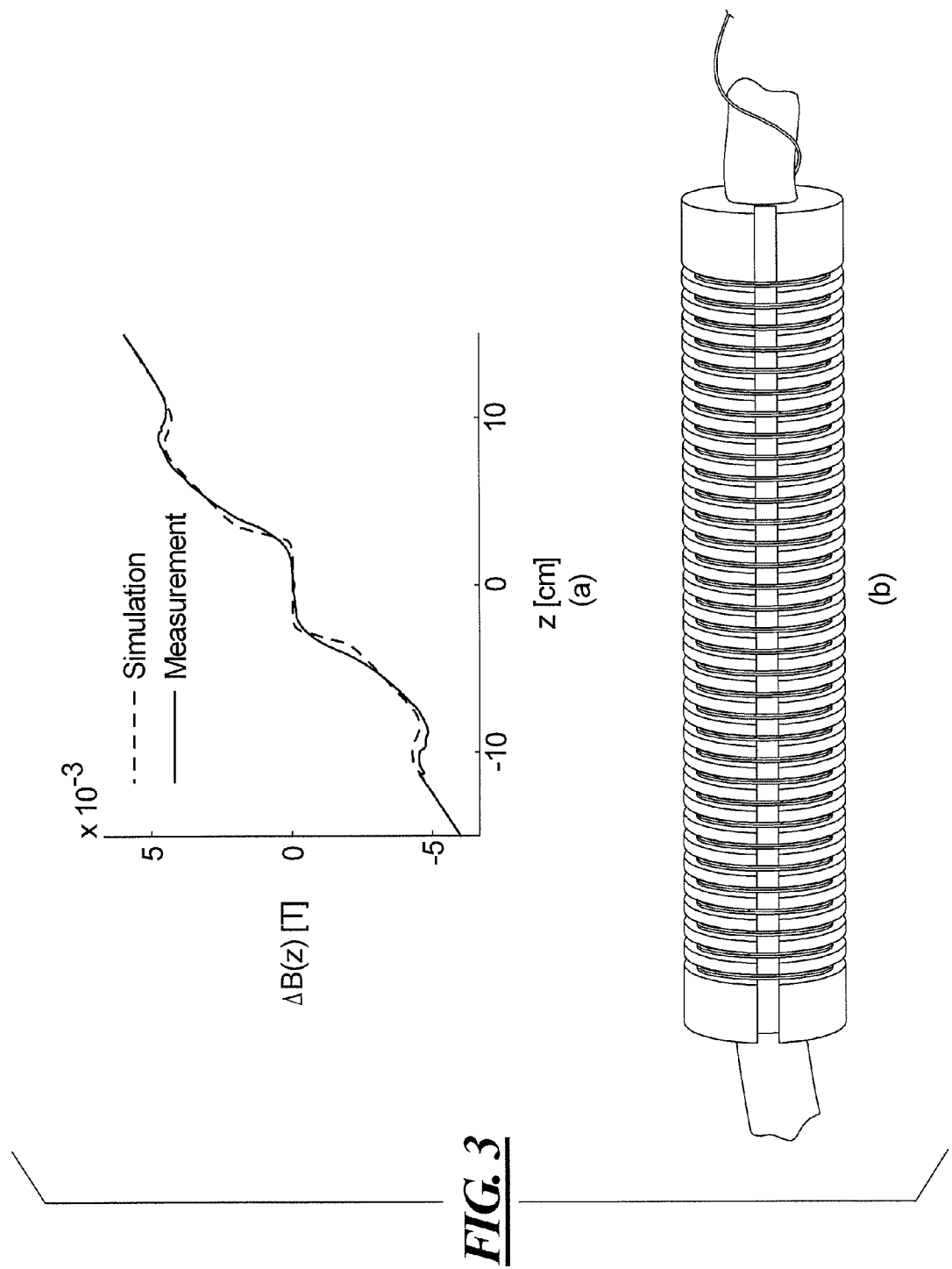
FIG. 3 shows the gradient coil wound to generate the field given in Eq. 7 and the field produced by the coil. a:The gradient coil that is wound on a polyoxymethylene cylinder is given together with the thin tubular phantom used in the experiment. The length of the coil is 20 cm, the separation and the radius of the windings are 5 mm and 2.4 cm, respectively. b:By feeding the coil with the phase encoding signal, the field generated can be extracted from the distortion in the resulting images. The measured field is compared with the simulated field.

Using the field expressions for a linear field bounded in a finite region (R. Turner, "A target field approach to optimal coil design," *J Phys D: Appl Phys*, vol. 19, pp. 147-151, 1986), two linear fields are designed to be used together with the z-gradient. One of these two fields is designed to be bounded in a region smaller than the other to generate high slopes at the boundaries. By adjusting the coefficients of the fields, the following field is obtained (FIG. 3a):

$$f(z) = z + 0.47 \frac{z}{1+\left(\frac{z}{0.09}\right)^{16}} - 1.47 \frac{z}{1+\left(\frac{z}{0.03}\right)^{16}}. \quad [7]$$

Figure 4:
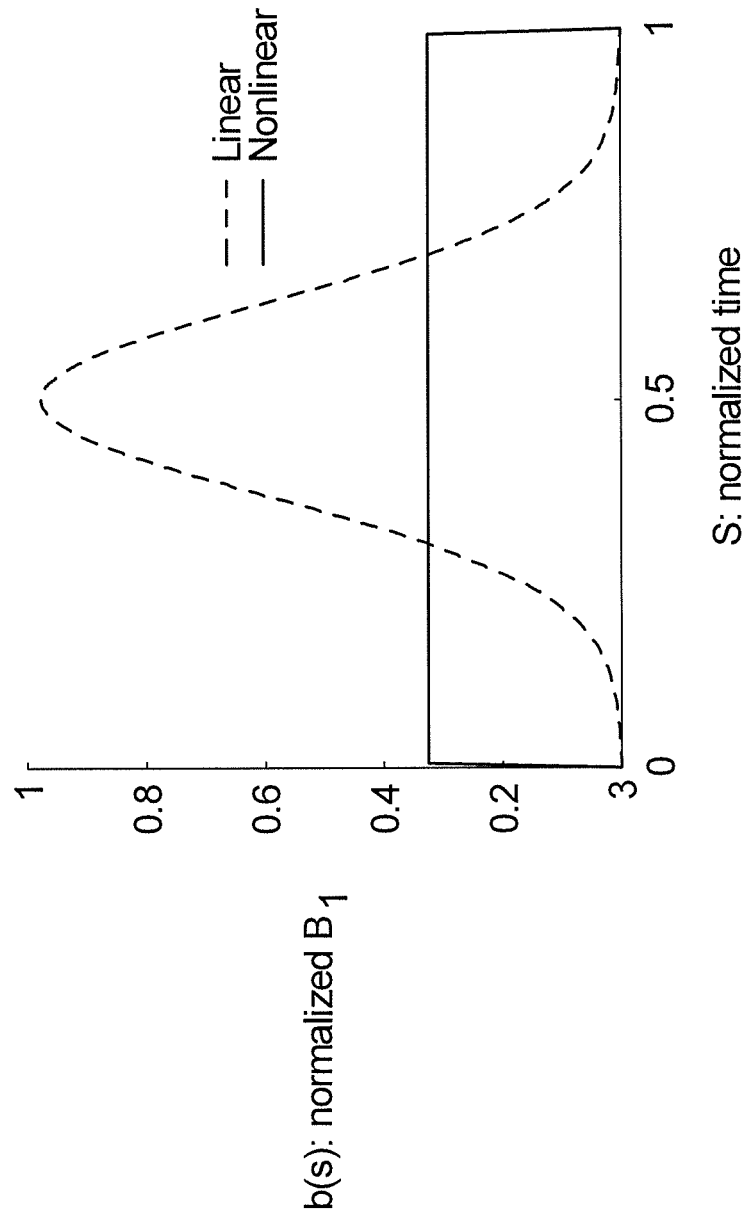
FIG. 4 shows the normalized apodized sinc and rectangular pulses.

To evaluate the excitation performance of the rectangular pulse, the same reference sequence as the previous example case is used (FIG. 1a-b). For both sequences, the RF envelopes are given in FIG. 4. To implement the idea experimentally, a coil is wound on a polyoxymethylene cylinder with a 2.4 cm diameter and a 20 cm length. Similar to the previous case, the current distribution along the z-direction that is required to obtain the field given in Eq. [7] is determined using the target-field method. Since the desired field magnitude in this case is higher than the previous case, the realized field is measured using MRI. By feeding the coil with the phase encoding signal during a gradient echo image, the field produced by the coil is extracted from the distortion in the resulting images (FIG. 3a). In the simulations, the field extracted from the MRI image is used as w=f(z) for the nonlinear case. In the experiments, the same experimental setup and the same sequence parameters are used as for the example case given in the previous section.

Case 3) 3D: Inhomogeneity Correction Using Multi-Dimensional Pulses

Multi-dimensional pulses are widely used for inhomogeneity correction purposes. However, the SAR of such pulses are significantly higher than conventional excitation pulses. By using nonlinear gradient fields, SAR of such multi-dimensional excitation pulses can be significantly reduced.

Figure 5:
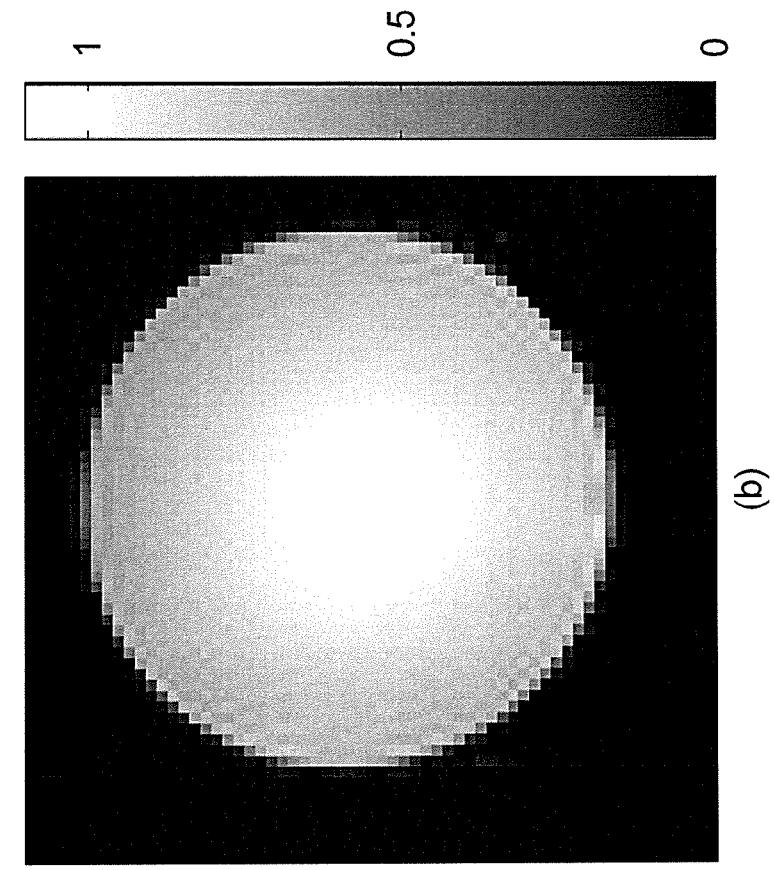
FIG. 5 shows when a conventional excitation pulse is applied, the resulting excitation profile shows that the central brightening effect is present in the system. a:Coronal plane with FOV: 15 cm×16 cm. b:Axial plane with FOV: 15 cm×15 cm.
Figure 5:
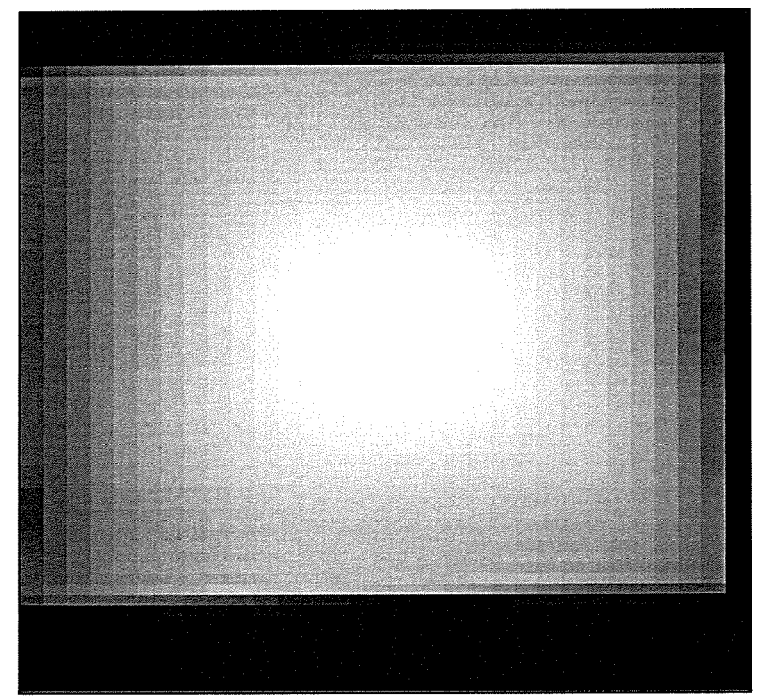

The B1 inhomogeneities, which are caused by wavelength effects, become more significant in the ultra-high field regime. However, even at lower field strengths such as 3T, such effects exist. FIG. 5 shows the axial and coronal images of a Siemens phantom (Model No: 8624186 K2285, Siemens, Germany) with a radius of 12 cm; the image is obtained using the body coil of a 3T Siemens TimTrio scanner. In order to mitigate the effects of the evident central brightening inhomogeneity, 2.5 ms long multi-dimensional excitation pulses are designed using linear and nonlinear gradient fields.

Figure 6:
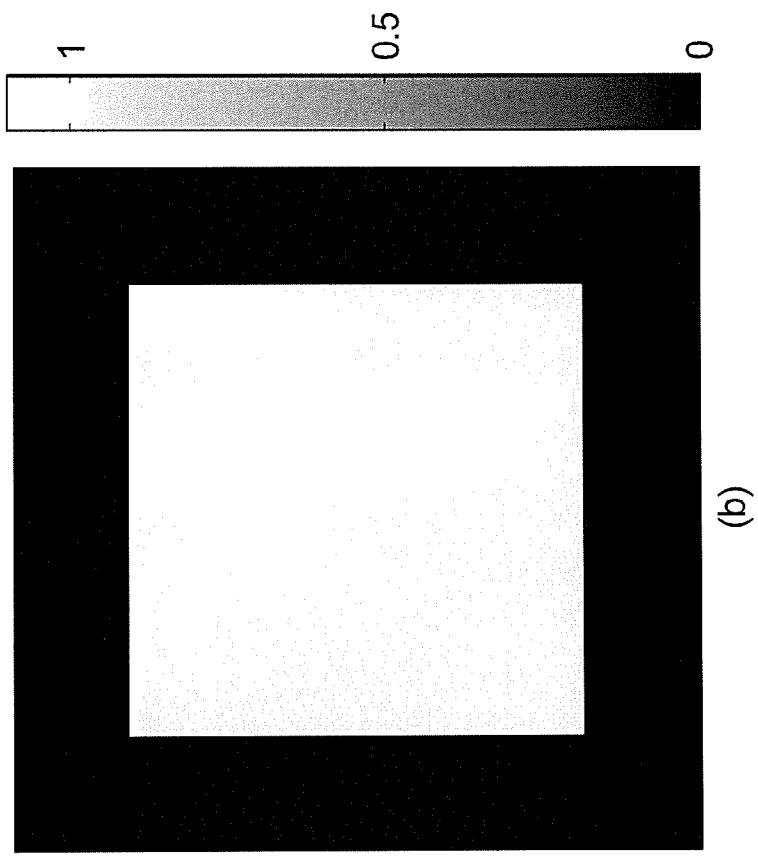
FIG. 6 shows the ideal excitation profile on the coronal (FOV: 15 cm×16 cm) and axial (FOV: 15 cm×15 cm) planes.
Figure 6:
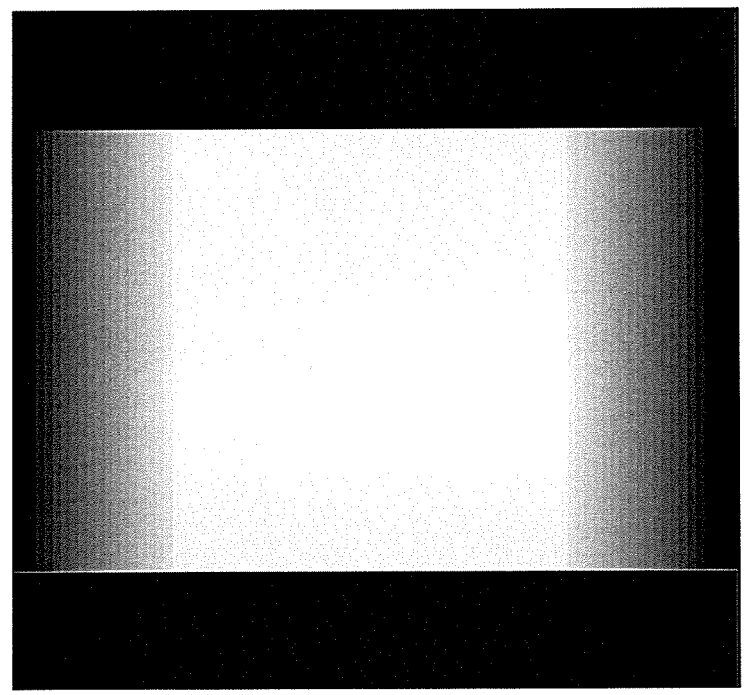

The desired excitation profile is a homogeneous slab with a 12 cm thickness along the z-axis with 1.5 cm thick transition regions exist at both ends of the desired excitation region (FIG. 6).

Figure 7:
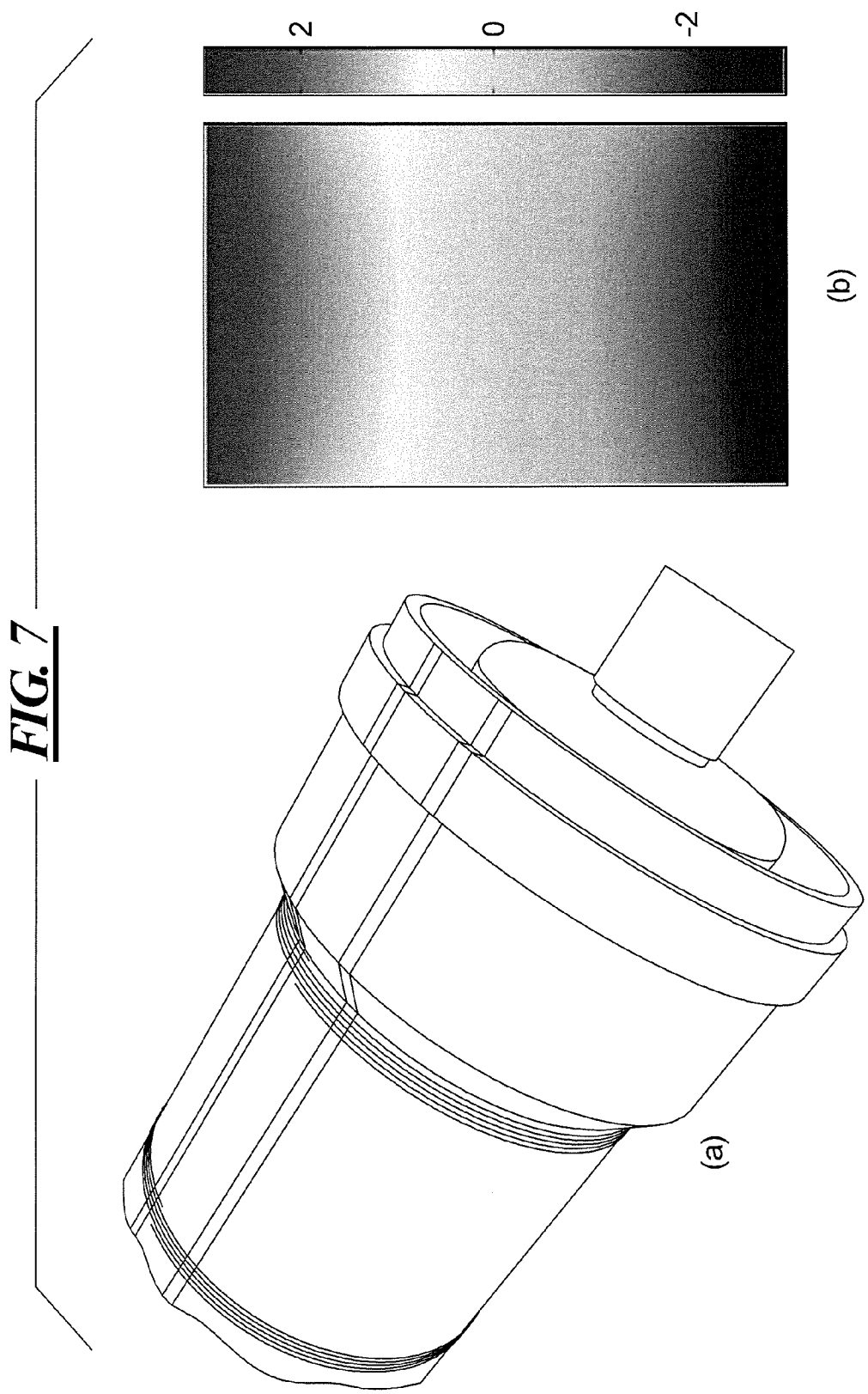
FIG. 7 shows the produced Maxwell coil and the simulated linear and nonlinear gradient fields are given. Note that the field is given on the coronal plane with FOV: 15 cm×16 cm and units of mT. All fields are cylindrically symmetric. a:The produced Maxwell coil with the Siemens phantom used in the experiments. b:The nonlinear gradient field obtained by using the Maxwell pair together with the z-gradient.

To demonstrate the effect of using a nonlinear gradient field on the SAR, we used a Maxwell-pair with a 15 cm radius and a 9.5 cm separation distance between the two turns (FIG. 7a). The coil is used together with the z-gradient, and therefore a nonlinear field is obtained with a slow variation inside the ROI and a rapid variation at the boundaries (FIG. 7b). We will refer to this total field as the "custom field" in this section.

The multi-spoke pulses were achieved with both linear and nonlinear gradient fields. Since this is a spoke excitation scheme, a gradient strength of 4.7 mT/m is used to assure that the excitation k-space (Fourier transform of the desired excitation profile) is sampled dense enough. The slew rate is 120 mT/m/msec and the pulse durations are 2.5 ms for both cases.

To evaluate excitation performance the root-mean-squared error of the obtained excitation profiles. By monitoring the z-channel as explained in the previous sections, amplifying and feeding the signal to the produced Maxwell pair, the experiments are performed. In the experiments, three-dimensional encoding is performed. In order to turn the Maxwell pair off during encoding, a relay is inserted between the monitoring system and the amplifier; the relay is controlled using a trigger signal generated by the scanner. In both simulated and experimental images, the FOV is 15 cm×15 cm×16 cm. The results will be given in the following sections.

Comparison with VERSE

In terms of its effect on the Fourier transform operation that relates the slice profile and the RF envelope, usage of nonlinear gradients resembles the variable-rate selective excitation (VERSE) technique, in the sense that with VERSE, the argument of the exponential of the Fourier transform is a nonlinear function of the input parameter, time. By contrast, for nonlinear gradients, the argument is a linear function of time, but a nonlinear function of the output variable, space. In conventional imaging methods that employ linear gradients and constant gradient waveforms in time, the argument of the exponential is a linear function of both time, and space. Although both methods transform the relation between the RF envelope and the slice profile from a linear Fourier transform into a nonlinear one, they act on different components of the process and therefore their advantages are distinct. Hence, fusing both methods into one is expected to be more advantageous than both methods used single-handedly.

For the technique of VERSE, off-resonance effects are possibly one of the biggest drawbacks (see Metzger). Because the gradient waveforms are a function of time, and off-resonance effects cause shifting of the slice profile boundary with the amount of shift depending on the gradient amplitude, off-resonance effects cause blurring when the VERSE technique is applied. With nonlinear gradients on the other hand, as the gradient waveforms are constant in time, blurring will not occur. Still, the shift will be position dependent, and may be more severe in some locations while being milder in other locations than the linear gradient cases, depending on the field shape.

For the inhomogeneity correction using multi-dimensional excitation pulses example given above, the VERSE algorithm is implemented. It is known that for the VERSE algorithm to be effective, at least one of the maximum gradient amplitude, maximum slew rate and total pulse duration parameters should be increased. By increasing the gradient amplitude by 10% and 25%, the VERSE algorithm is applied. The results will be given in the following sections.

Other Possible Implementations

Slab Imaging

Instead of exciting a thin slice, imaging it, then passing onto the next slice to cover the volume of interest, a thick region is excited in slab imaging techniques. To obtain the images at the end, a second phase encoding scheme is applied along the slice selection direction. This enables dividing the data obtained from the thick volume of interest to smaller volumes and yields images of thin slice at the end. A known advantage of this method is the increase in the SNR.

Figure 8:
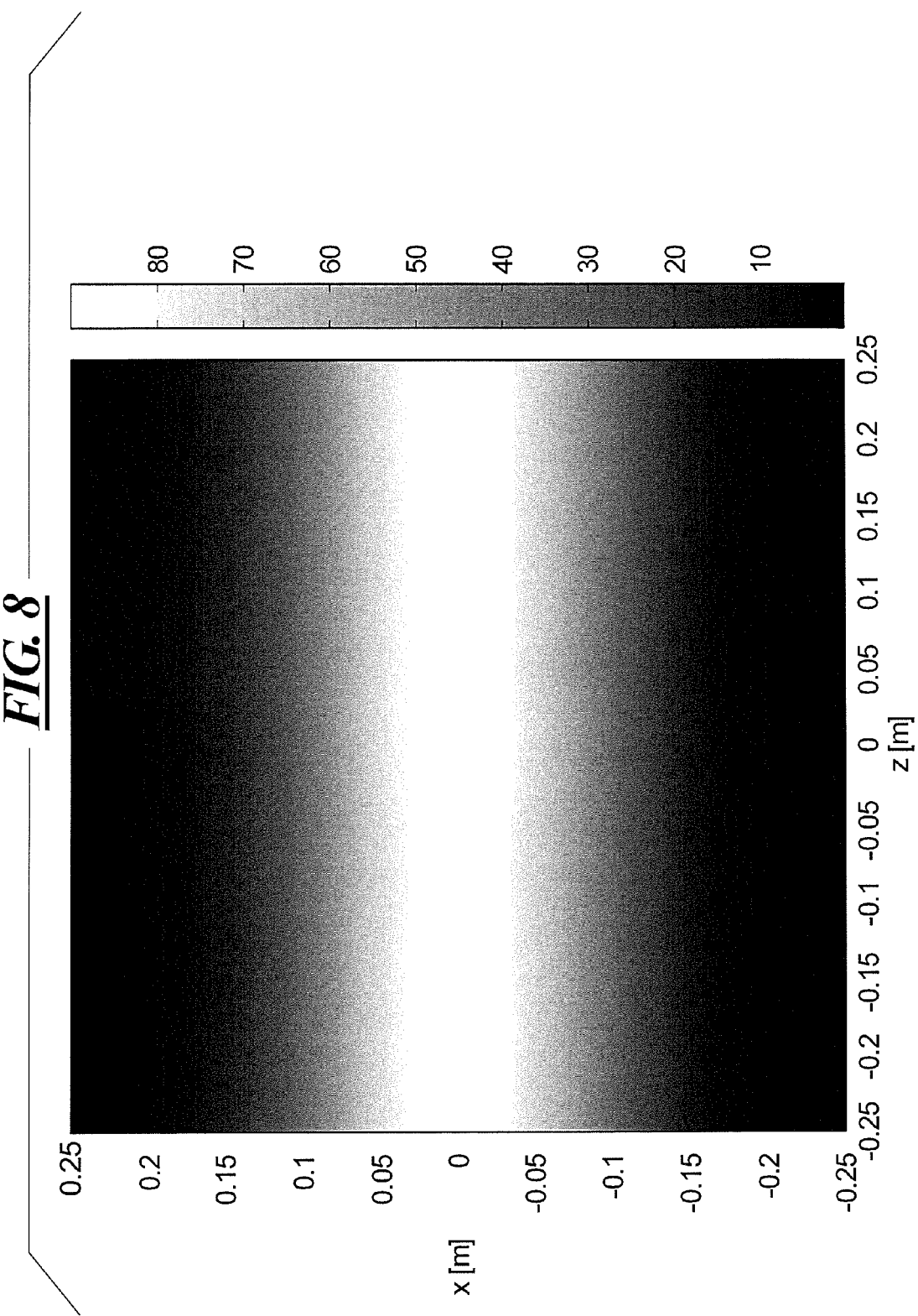
FIG. 8 shows a simulated slab profile of the sinc(t) pulse obtained and scaled from reference sequence, before edges are discarded using post-processing.
Figure 9:
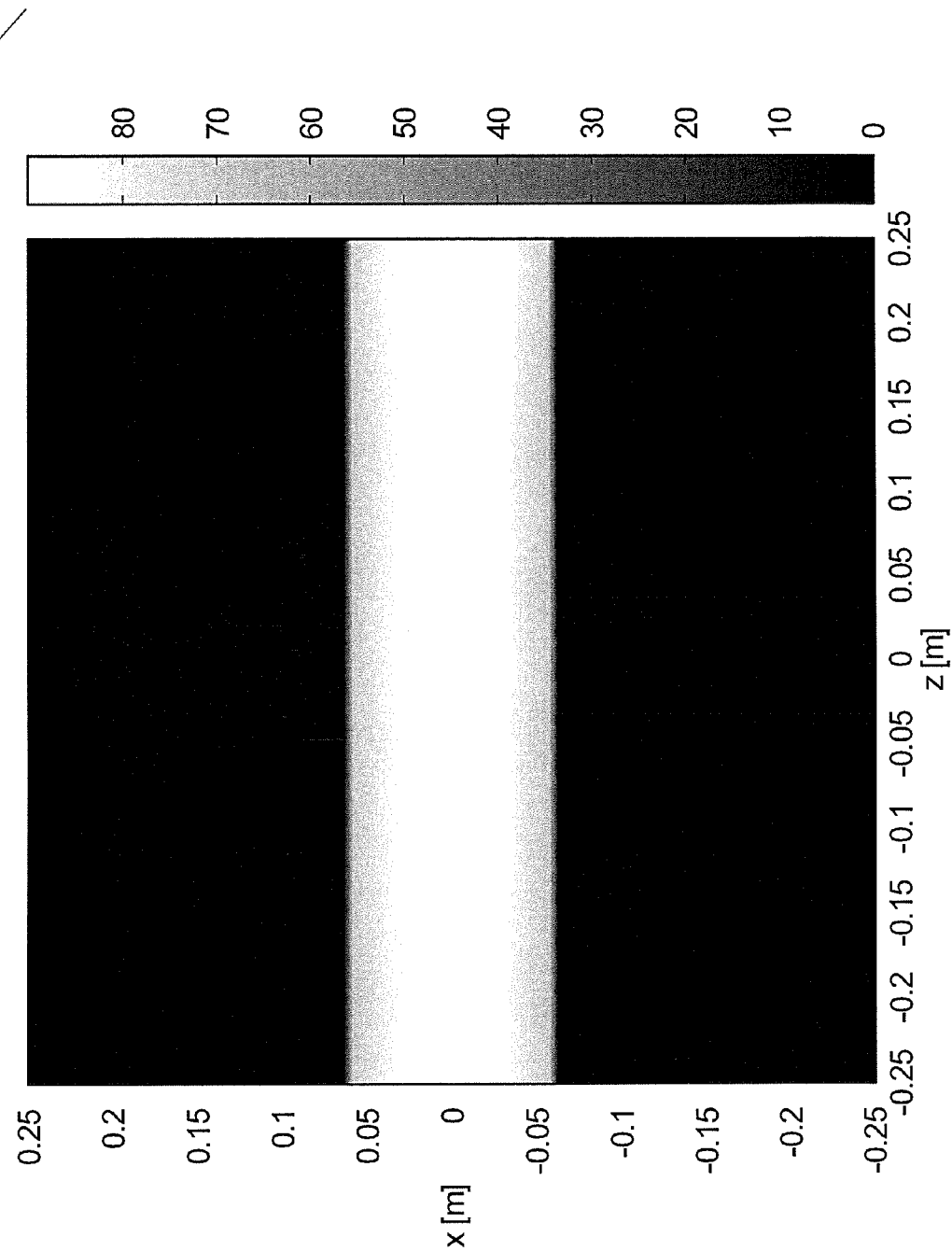
FIG. 9 shows a simulated slab profile of the sinc(t) pulse obtained and scaled from reference sequence, after edges are discarded using post-processing.

As shown in FIG. 1b, the transition region between the excitation and no-excitation regions of a sinc(t) pulse is wide. Hence, some of the data, which correspond to the edges of the excitation region, is discarded in slab imaging (FIGS. 8-9).

Figure 10:
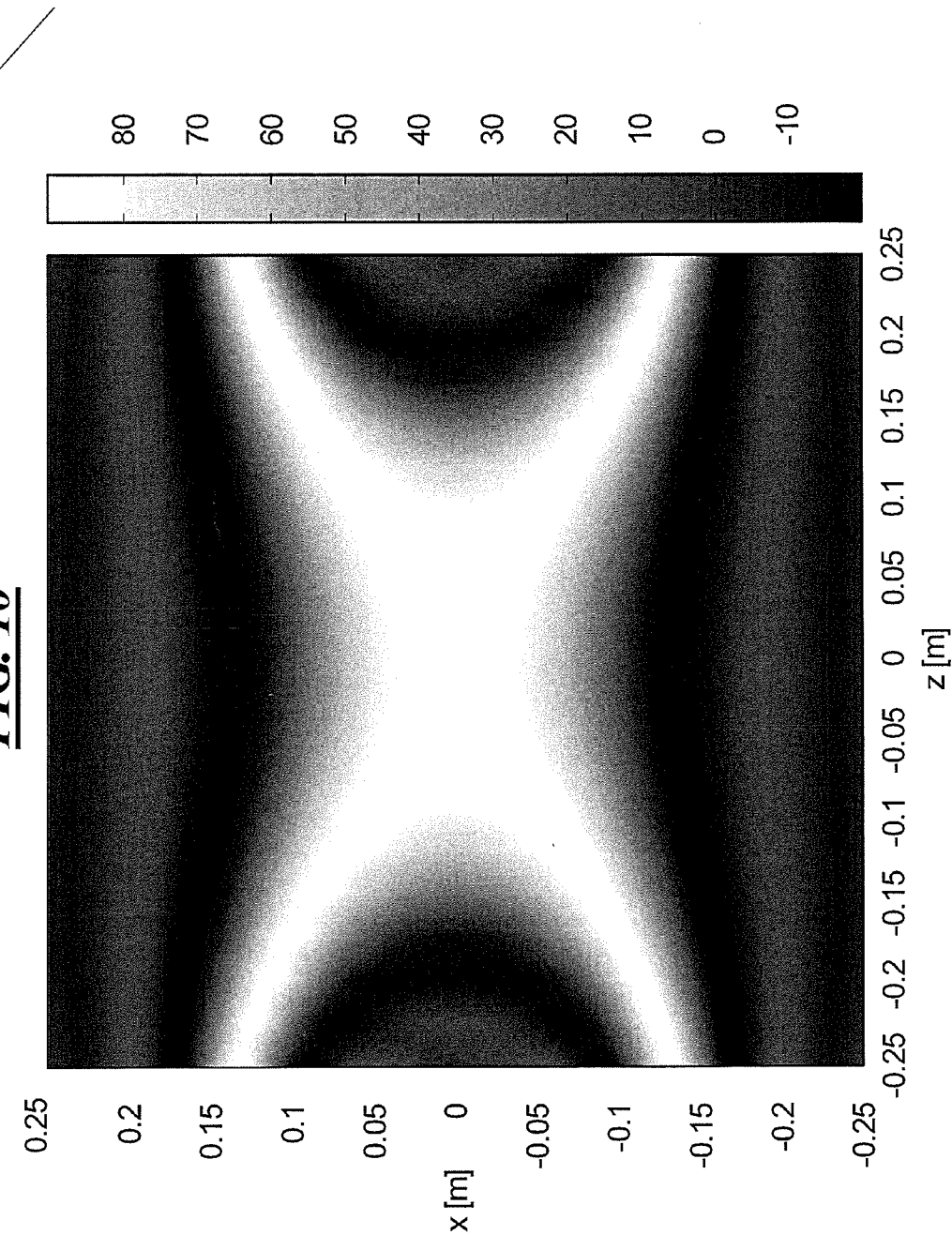
FIG. 10 shows a simulated slab profile in accordance with the inventive method, before edges are discarded using post-processing.
Figure 11:
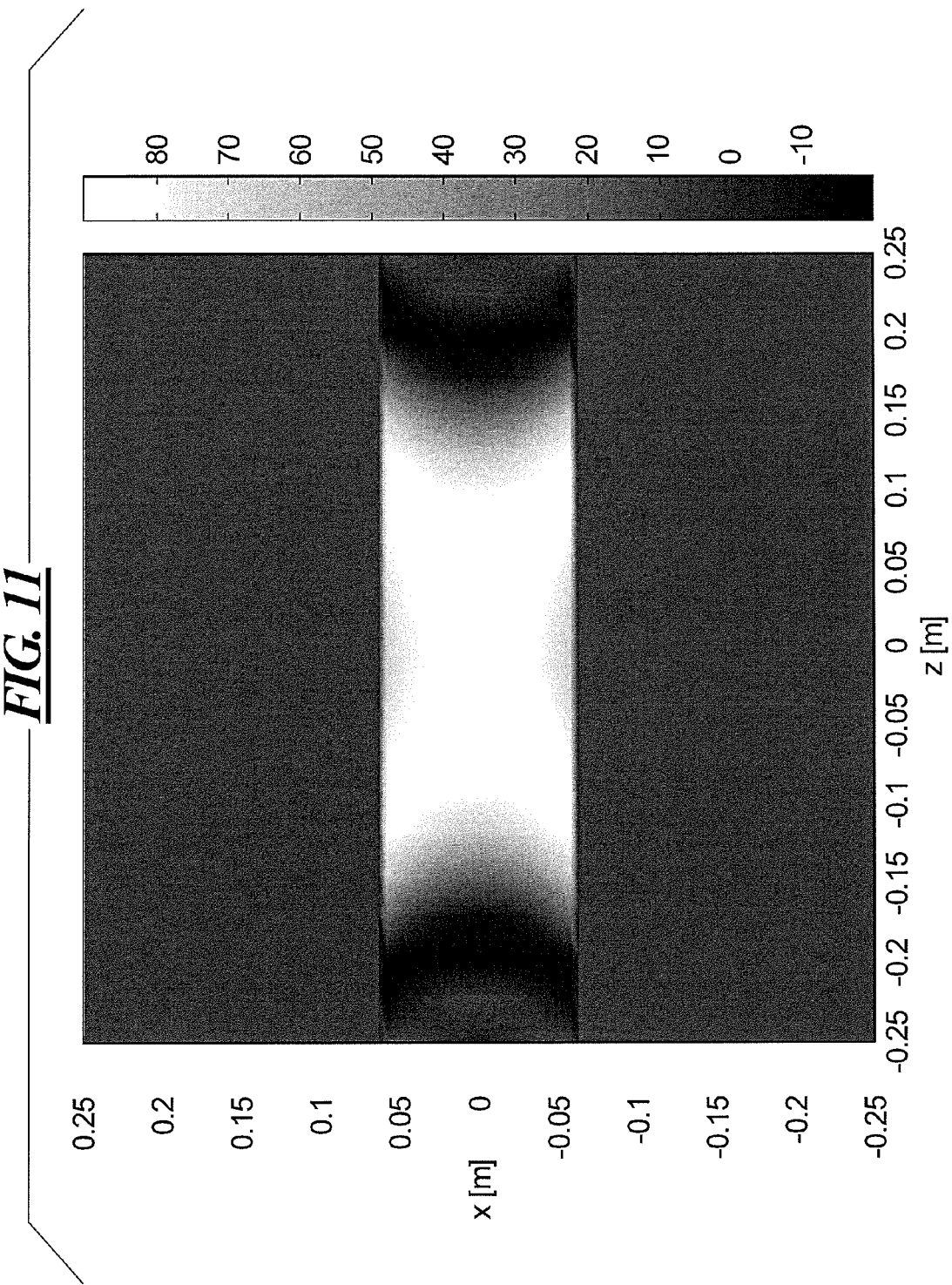
FIG. 11 shows a simulated slab profile in accordance with the inventive method, after edges are discarded using post-processing.

As mentioned, the slice profile obtained with the proposed method becomes a function of the transverse coordinates, when sample radius becomes comparable with the length of the excitation region. In accordance with the invention, the same approach can be implemented such that the regions toward the edges can be discarded. This way, the data for the same volume of interest can be obtained with less SAR (FIGS. 10-11).

It should be noted that, in the provided simulations, the effect of finite number of phase encoding steps along the slab selection direction is not taken into account. It can be seen from the FIGS. 8-11 that the regions kept after post processing are very similar, in a cylindrical region with 20 cm diameter. Only the xz-plane is shown in FIGS. 8-11 due to the cylindrical symmetry of the slab profile.

Excitation Region Localization

When a nonlinear gradient field is used with a conventional excitation pulse, the resulting excitation region is bounded along more than one direction, since a nonlinear gradient field varies along at least two directions. Therefore, the excitation region can be focused without the need for multi-dimensional excitation pulses or similar approaches. When an apodized sinc(t) pulse is used similar to the one used for the linear case in the Slab Imaging section above, the side lobes that are seen in FIG. 10 will be attenuated, and the excitation region will be as given in FIG. 12. Therefore, the excitation region is not only localized along the z-axis, but also on the xy plane, without increasing the SAR. This technique can be used to reduce the field-of-view (FOV) in an MRI exam.

Reduced Field of View Imaging

Figure 12:
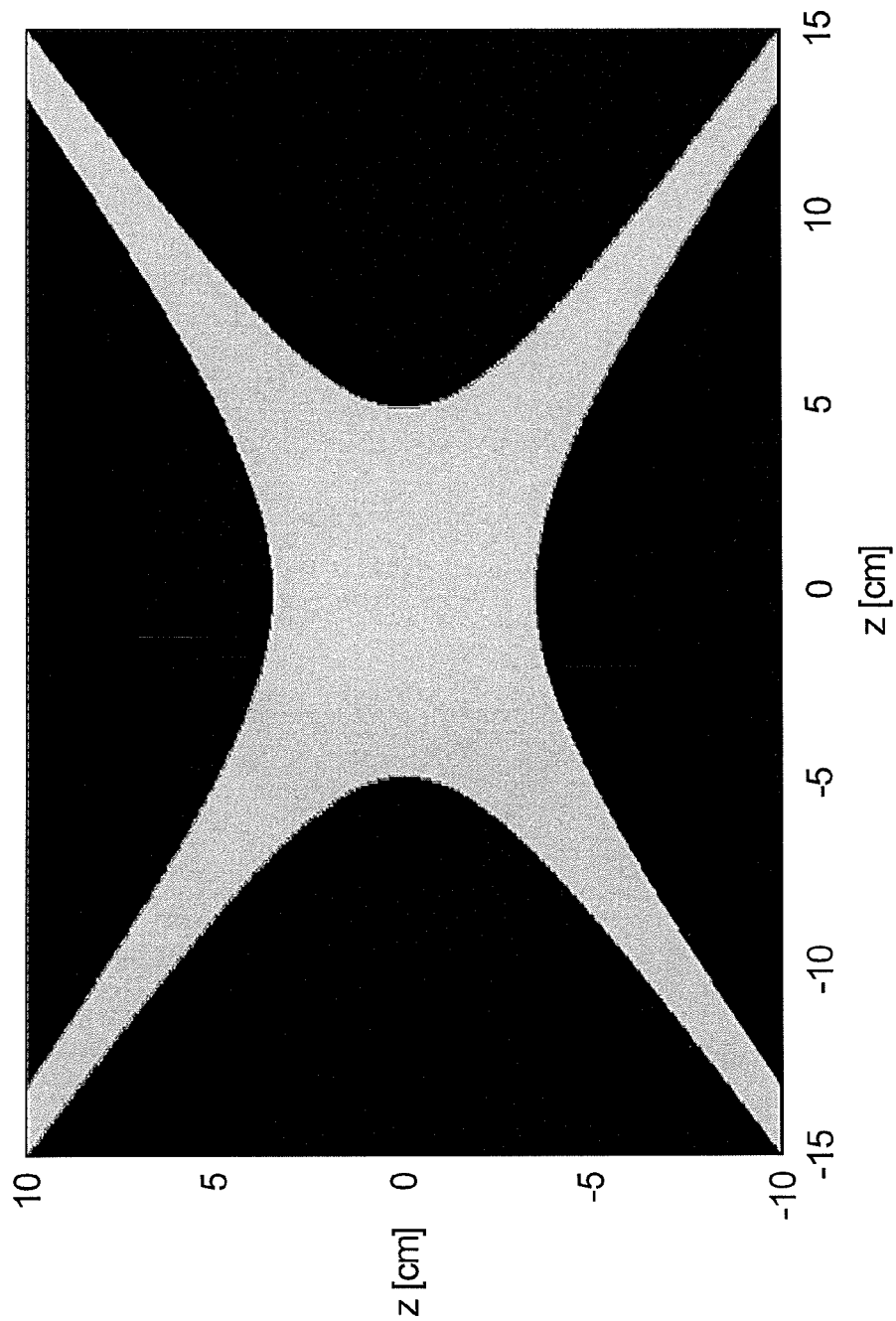
FIG. 12 shows a simulated slab profile in accordance with the inventive method where the excitation pulse envelope is sinc(t).
Figure 13:
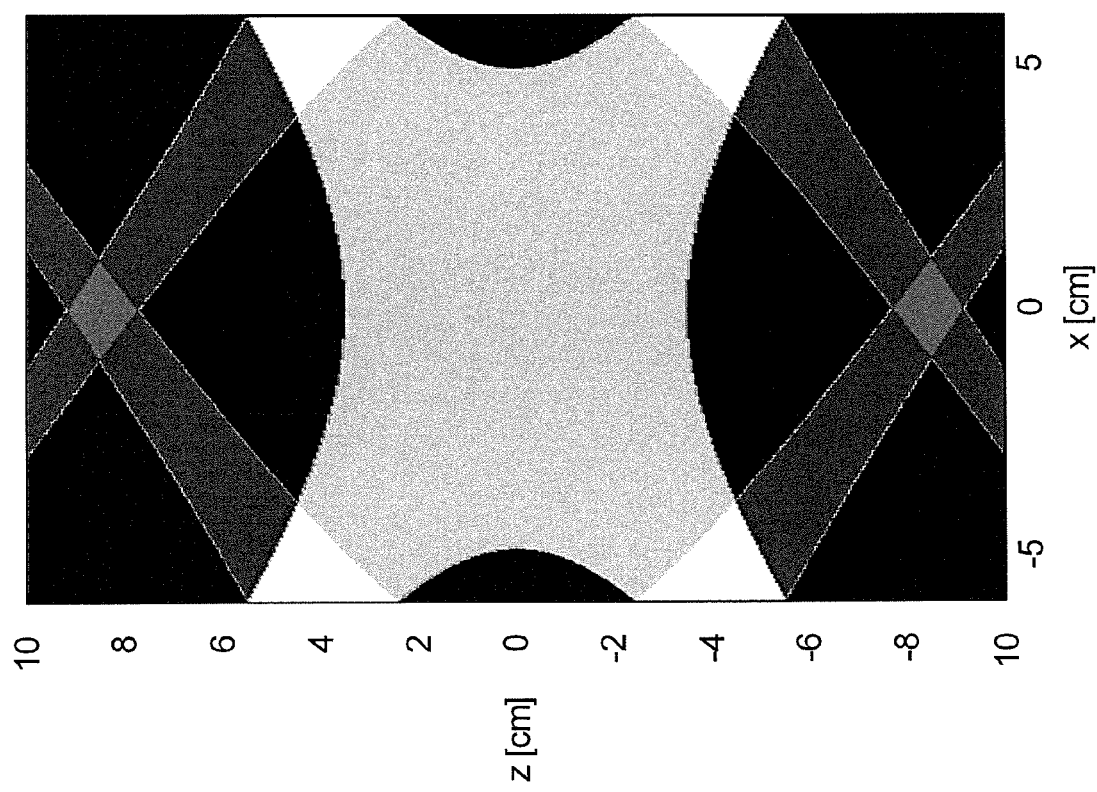
FIG. 13 shows a simulated slab profile in accordance with the inventive method where the excitation pulse envelope is sinc(t), after the encoded FOV is reduced. The folding artifacts do not corrupt the central region.

Furthermore, when the encoded field-of-view (FOX) is reduced with the proposed approach, the extensions on the corners do not fold into the region at the center (FIGS. 12-13). Therefore, the FOX can be reduced without any artifacts, and the method can be used to decrease the total scan time. In order to demonstrate the idea, volunteer experiments are performed. The results will be presented in the following sections.

Spin Echo and Turbo-Spin Echo

When gradient echo images are obtained, an excitation RF pulse is transmitted, and the echo is obtained using gradient signals. In spin echo sequences on the other hand, after the excitation pulse, a 180° pulse is transmitted to refocus the spins and obtain an echo. In turbo spin echo sequences, multiple 180° pulses are transmitted to obtain multiple echo signals. For an excitation signal of α degrees, the SAR of the refocusing pulse is $180^2/\alpha^2$ times the SAR of the excitation pulse.

Due to the dependence of the slice profile on the transverse coordinates, the slice selection capabilities of the proposed method is limited when a thin slice is to be selected in a large sample. However, when the excitation pulse is a sinc(t) pulse, and the refocusing pulse is a hard pulse applied in the presence of a nonlinear gradient, the SAR of spin echo and turbo spin echo sequences can be reduced significantly. For example, for a sinc(t) pulse with a single side lobe, the SAR can be reduced by 70% by replacing it with a rectangular pulse. Hence, for a 90-180° sequence, the SAR can be reduced by 56% by replacing the refocusing pulse with a hard pulse while keeping the excitation pulse as a one side-lobe sinc pulse. For smaller flip angle excitations and higher number of echoes, the reduction will increase, with 70% being the upper limit.

An important point to note is that when a rectangular pulse is used with a nonlinear gradient field, the region of 180°-excitation can be thick, similar to the slab imaging case. Hence, if multi-slice imaging ° is made, the slice that is to be excited next is flipped by 180° several times, which will decrease the signal strength. As an example, for TE=3 ms, $T_1$=250 ms and number of echoes:3, there will be a signal loss around 3% in the obtained images.

$B_1$ Inhomogeneity Correction

Figure 14B:
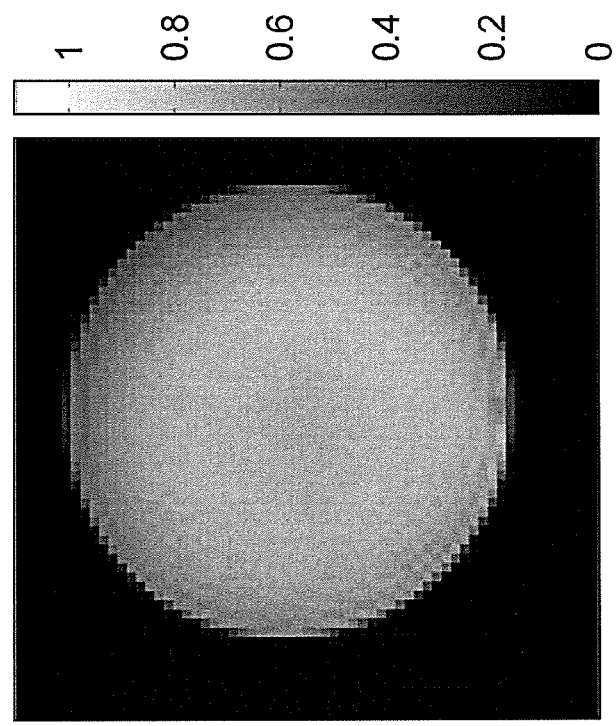
FIG. 14 shows a simulated slice profile in the presence of central brightening effect (FIG. 5), wherein the slice profile is corrected using a nonlinear gradient field distribution. a: coronal plane. b: axial plane.
Figure 14A:
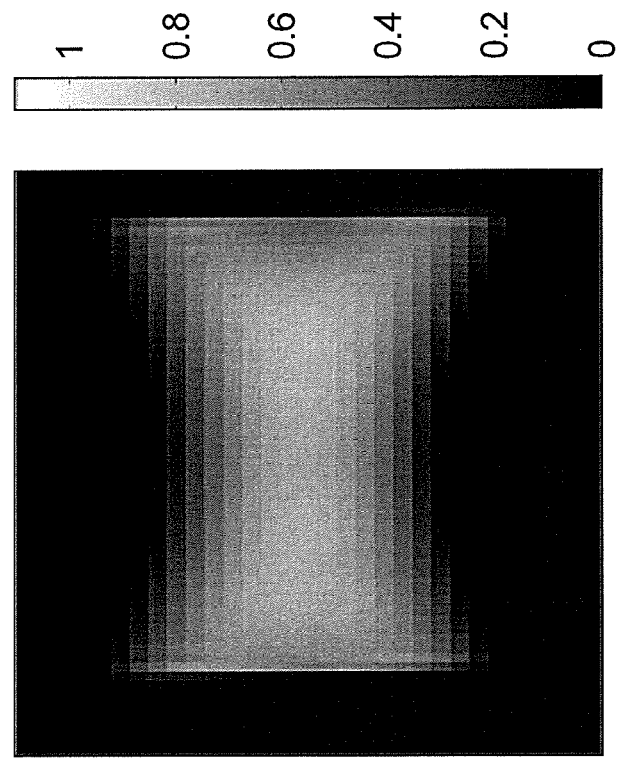

During excitation, a spin inside the volume of interest observes a gradient field and is flipped by the amount of RF power that is transmitted at that frequency. When a linear gradient is applied, the spins that lie on a direction orthogonal to the direction of the gradient are flipped by the same amount. However, with nonlinear gradients, the slice profile can be shaped in such a way that the contours of same flip angle are not linear anymore. This way, the spins in a curved region can be flipped more than spins in the surrounding regions. Hence, $B_1$ inhomogeneities can be compensated. FIG. 14 illustrates such a case. In FIG. 5, the central brightening inhomogeneity mentioned in the previous sections was shown. By using a nonlinear gradient field with distribution $$[(z-0.1)^3-3(z-0.1)(x^2+y^2)^2]-[(z+0.1)^3-3(z+0.1)(x^2+y^2)^2] \quad [8],$$

a more uniform excitation profile can be obtained in the presence of the inhomogeneity, as shown in FIG. 14. Note that, a conventional excitation scheme with an apodized sinc RF envelope is used in the example. Although the boundaries of the excitation region are curved, in such a case an approach as summarized in the Slab Imaging section can be employed to discard the boundaries.

Curved Slice Imaging

Figure 15:
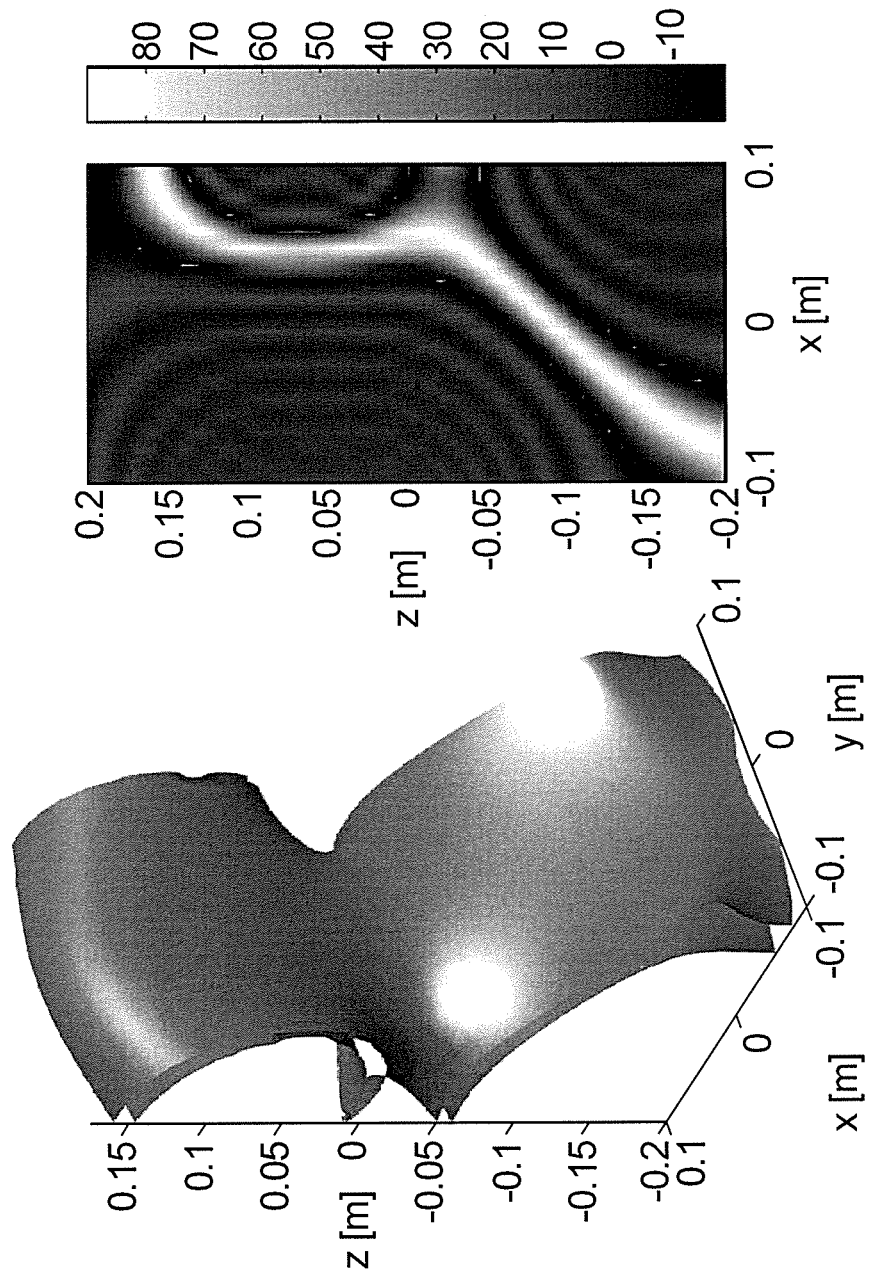
FIG. 15 shows a simulated slice profile in the presence of nonlinear gradient, designed to select a curved slice, wherein the excitation region in which the flip angle is above 90% of the intended value. Right figure shows y=0 plane.

As mentioned above, using nonlinear gradient enables tailoring the slice profile to curved profiles. Hence, using nonlinear gradients, an arbitrarily shaped slice can be excited. With this technique, imaging of internal organs, blood vessels, spine, cartilages and similar structures can be accomplished. Although such techniques exist, they use RF encoding (Bornert, Kopanoglu 2010), the SAR is high. With the proposed technique, instead of RF encoding, gradient encoding is used, hence SAR is not higher than conventional slice selection methods. Furthermore, rectangular pulses can be used for excitation with carefully designed gradient fields. FIG. 15 shows an example slice profile obtained using a rectangular pulse. With a sinc(t) envelope, the side lobes seen on the right figure can also be canceled.

Continuous Transmission and Reception

In contrast to conventional MRI methods that sequentially transmit and receive RF signals to and from the body, respectively, alternative imaging schemes that transmit an RF pulse to the body to be imaged, and simultaneously receive the signal transmitted back from the body, may be used. Nonlinear gradient fields may be used for excitation in such imaging schemes to select a region with low SAR, or to select a region with curved boundaries.

Travelling Wave MRI

In conventional MRI methods, RF signal transmission and reception are accomplished using coils that are around the body, in order to generate a standing wave pattern inside the body using RF coils. In alternative imaging schemes, where the transmission and/or reception coils are located such that the travelling components of the electromagnetic waves are used, nonlinear gradient fields may be used for excitation in such imaging schemes to select a region with low SAR, or to select a region with curved boundaries.

Results of Case 1) 1D: Pulse Design for a Given Nonlinear Field

Figure 16A:
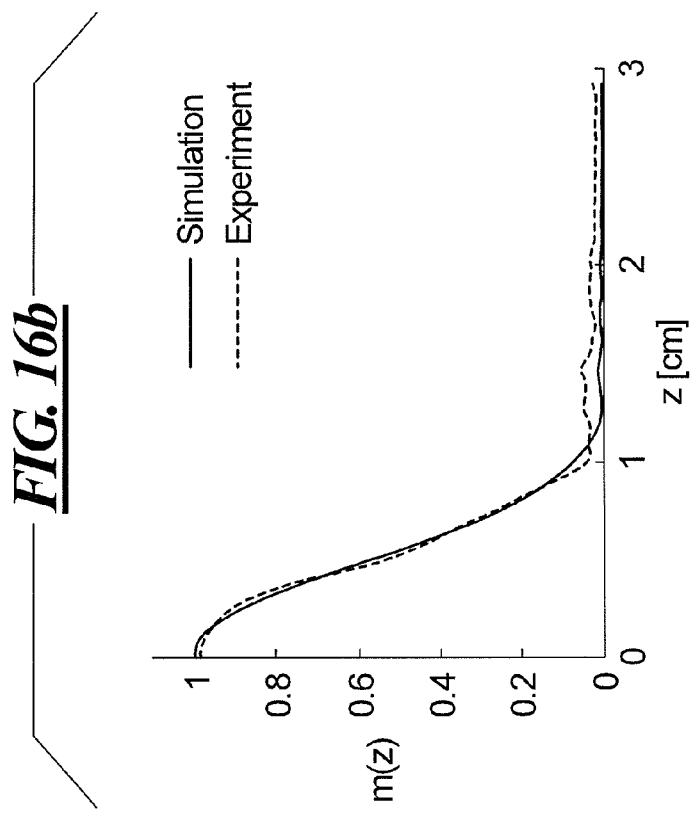
FIG. 16 shows a comparison of the excitation profiles. a:The excitation profile for the linear case. b:The excitation profile for the nonlinear case. Note that, due to the symmetry of the excitation profiles, only z>0 halves are given.
Figure 16B:
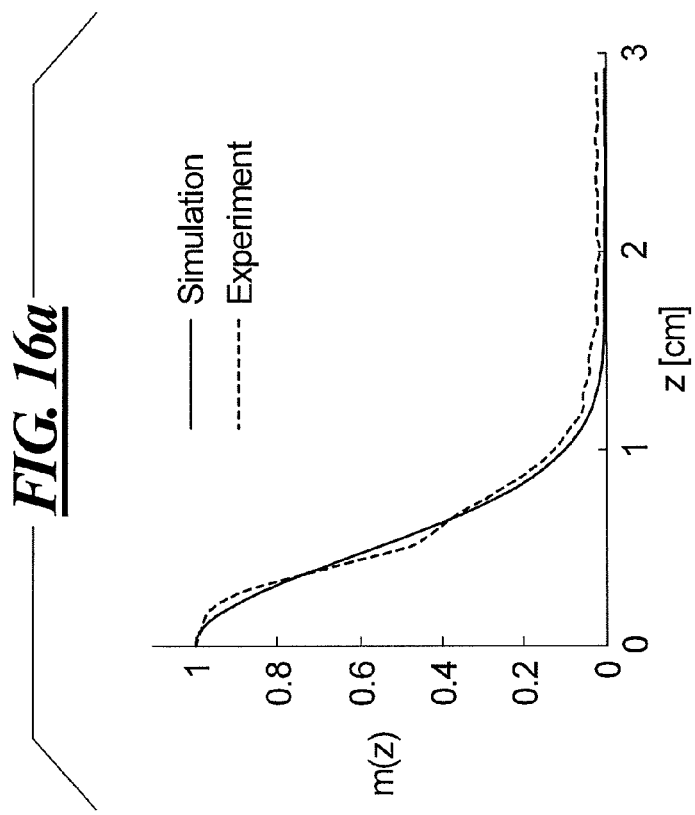

For the pulse designed to operate in the presence of the slight nonlinearity shown in FIG. 1c, the RF envelopes are given in FIG. 1d, and the computational and experimental excitation profiles are given in FIG. 16. The normalized SAR of the linear case is 2.16 whereas for the nonlinear case, nSAR is 1.85. Hence, the nSAR is reduced by 15%. The excitation profile for the nonlinear case has small oscillations outside the main lobe, which causes a 0.5% error in the simulations. When the desired current distribution is truncated, the boundaries of the excitation region are slightly contracted as expected and thus, the error increased to 1.2%. In the experiments, the error between the linear and nonlinear cases is 2.9%. The rms error between the simulation and the experiment is 3.1% for the linear case and 3.4% for the nonlinear case. It can be seen that even with a slight nonlinearity, the SAR can be reduced without affecting the excitation profile.

Results of Case 2) 1D: Field Design for Optimal SAR Pulses

Figure 17B:
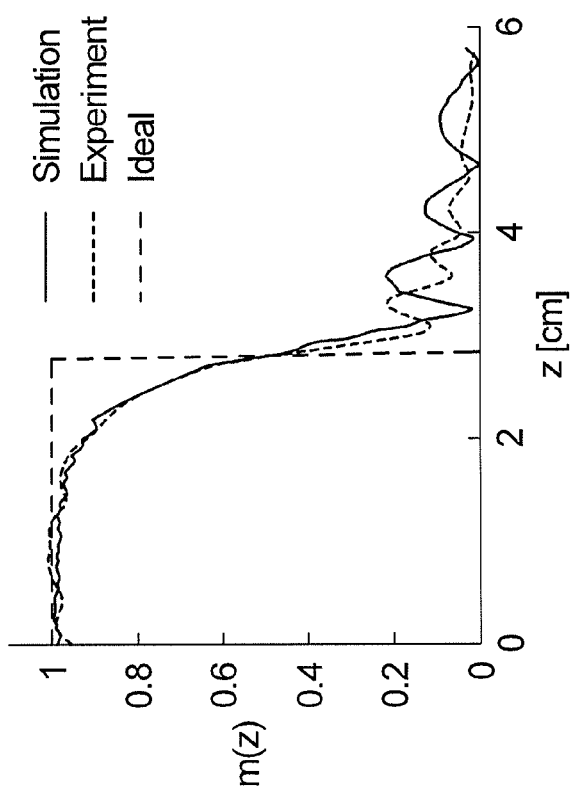
FIG. 17 shows a comparison of the excitation profiles. a:The excitation profile of the apodized sinc pulse in the presence of the linear gradient field. b:The excitation profile of the rectangular pulse in the presence of the designed nonlinear gradient field. The nonlinear field measured using MRI is used in the simulations. Due to the symmetry of the excitation profiles, only z>0 halves are given.
Figure 17A:
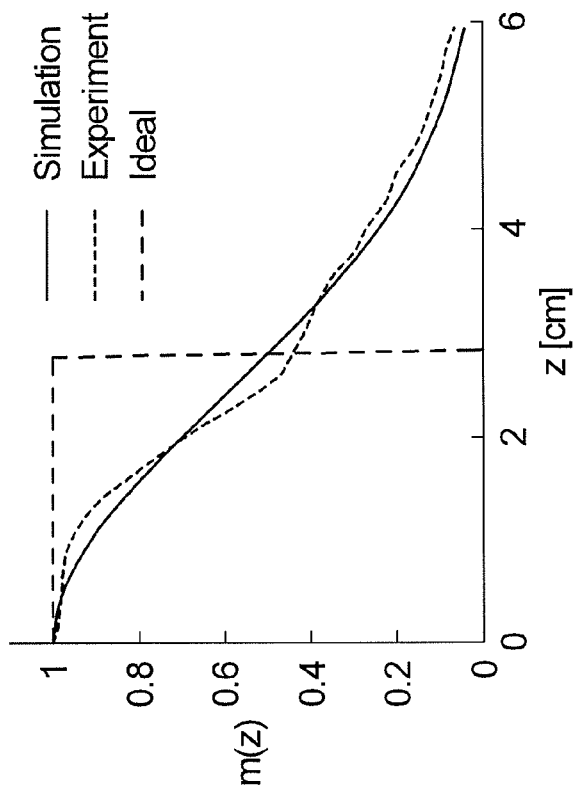

For the field designed to yield a selective excitation profile when a rectangular RF pulse is used (FIGS. 3-4), the normalized SAR is reduced by 54% (from 2.16 to 1). The rms error between the computational and experimental profiles (FIG. 17) is 3.4% for the linear and 4.9% for the nonlinear cases. When the excitation profiles are compared with the ideal profile (FIG. 17), the error values for the linear case are 24.5% in the simulations and 25.6% in the experiments; whereas for the nonlinear case, the error values are 13.2% and 12.0%, respectively. For this example, it is clear that the excitation profile obtained using the rectangular pulse more closely resembles the ideal excitation profile, than the reference solution. To obtain more selective excitation profiles in the linear case, the number of side lobes of the sinc pulse can be increased along with an increase in the nSAR. For sinc pulses with one, two and three side lobes, the rms error drops to 21.7%, 17.5% and 15.2%, respectively, while, the nSAR increases to 3.1, 5.2 and 7.2, respectively. If the pulse is slightly longer than a sinc pulse with four side lobes, the rms error can be reduced to 13.2% as in the nonlinear case. However, this increases the nSAR to 9.8. Therefore, in contrast to the linear gradient fields, nonlinear gradient fields can significantly reduce the SAR while obtaining more selective excitation profiles.

Results of Case 3) 3D: Inhomogeneity Correction Using Multi-Dimensional Pulses

Figure 18:
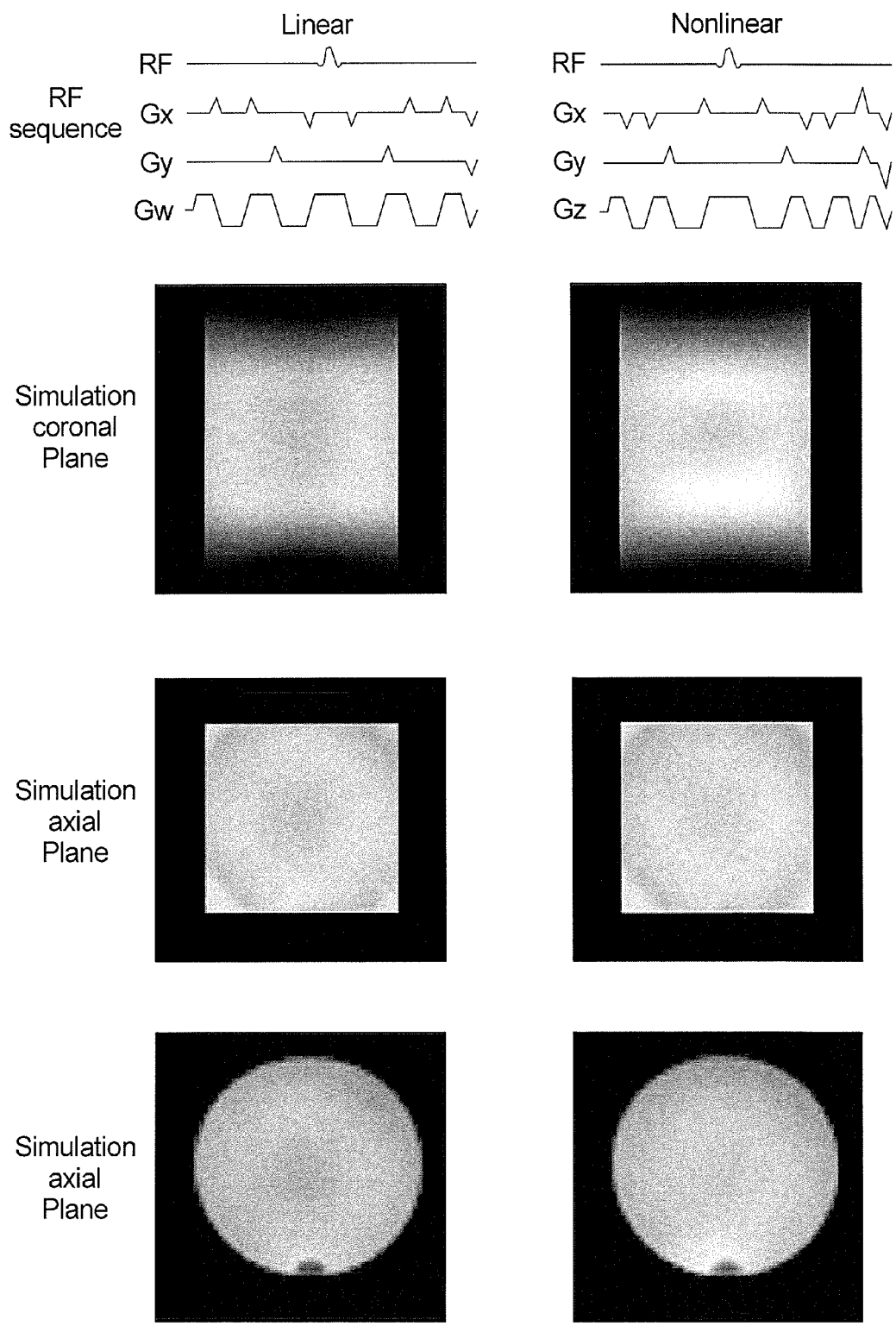
FIG. 18 shows a comparison of the RF pulses and excitation pulses obtained for the linear and nonlinear cases.

In the three-dimensional example, when a conventional excitation pulse is used, the rms error in the excitation profile is 16%, compared with the ideal profile. When the multi-spoke RF pulse designed for the linear case is used, the rms error is reduced to 4% (FIG. 18). However, the nSAR of the RF pulse is 110.9. When the custom field is used in place of the z gradient, the nSAR is reduced by 26% to 82.6, although the rms error is increased slightly to 5% (FIG. 18).

Figure 19:
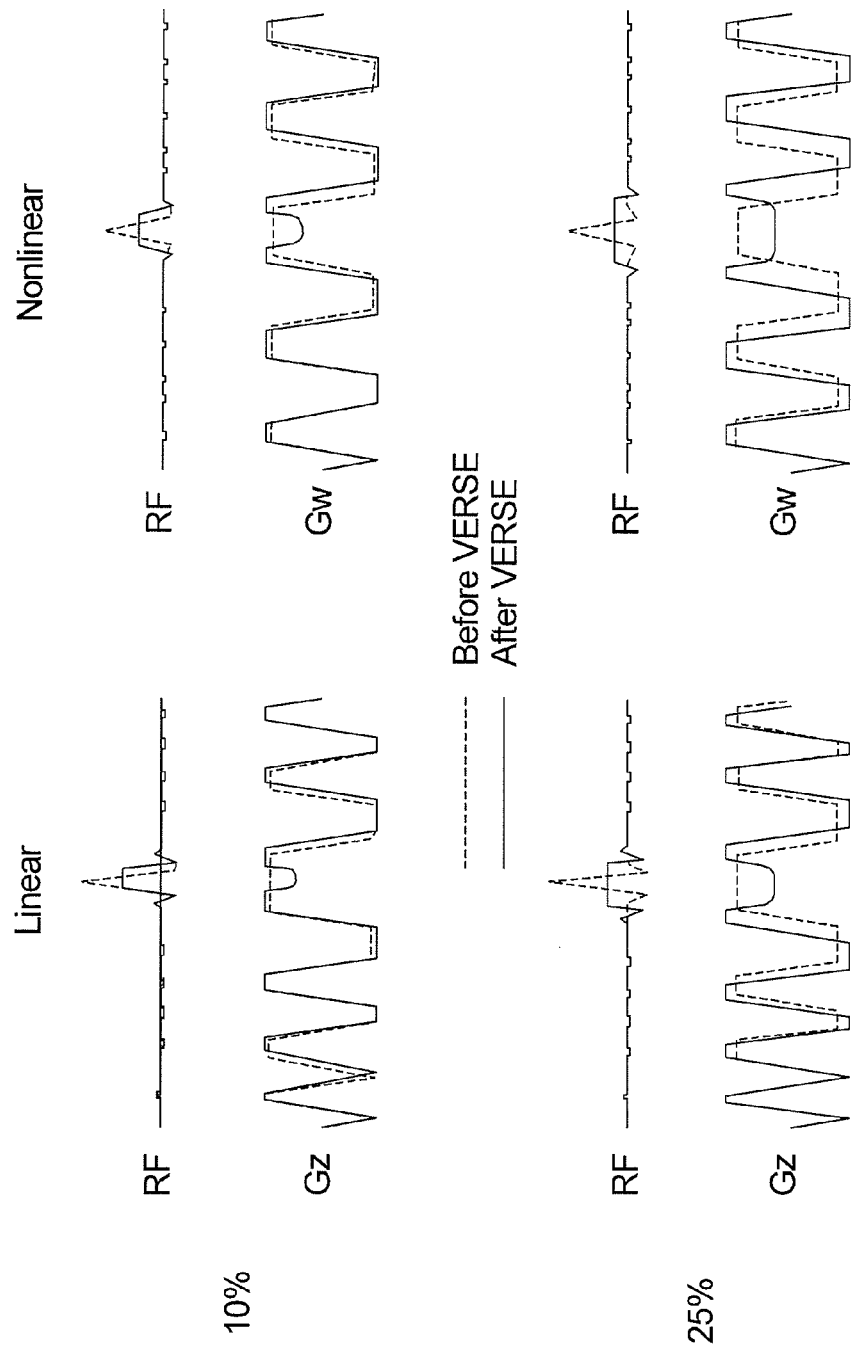
FIG. 19 shows a comparison of the RF pulses for the linear and nonlinear cases, when the VERSE algorithm is implemented. For the VERSE algorithm, 10% and 25% increase in the maximum gradient amplitude are allowed.

When the VERSE algorithm is implemented by increasing the maximum gradient amplitude by 10%, the nSAR values are reduced to 70 in the linear case and 42.6 in the nonlinear case, which yields a 39% lower SAR value for the nonlinear case (FIG. 19). When the maximum gradient amplitude is instead increased by 25%, the normalized SAR values are reduced to 40 and 24.2 for the linear and nonlinear cases, respectively, which again yields an SAR value that is 39% lower for the nonlinear case (FIG. 19).

Results of Reduced Field of View Imaging

Figure 21:
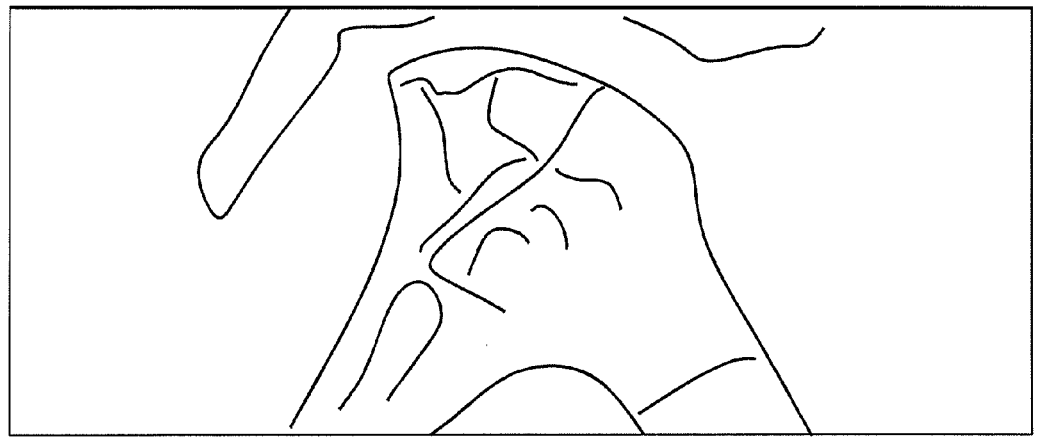
FIG. 21 shows a sagittal obtained in the volunteer experiment, demonstrating the artifact free region at the center and the folding artifacts at surrounding regions.
Figure 20:
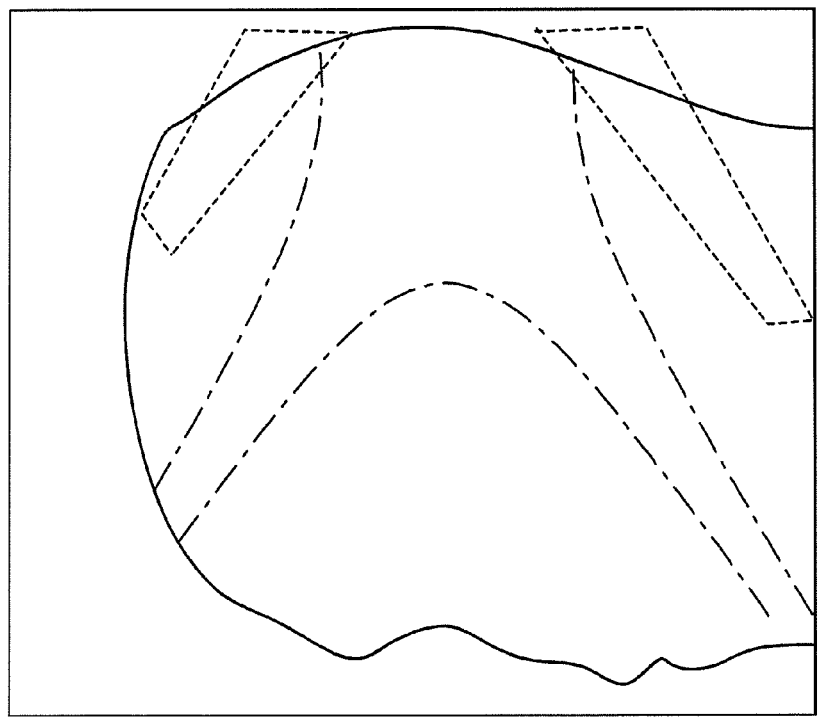
FIG. 20 shows the expected excitation profile is superposed on the sagittal head image of the volunteer. When the encoded field-of-view (FOX) is reduced to the regions indicated by the rectangles outside the image, the extensions of the excitation region are expected to fold into the FOX as indicated.

An A20 field (distribution: $2z^2-x^2-y^2$) is used in the experiment. The expected excitation region is superposed on the sagittal image of the volunteer's head (FIG. 20). The rectangles that are outside the image demonstrate the encoded FOV (FOX). The expected folding artifacts are also shaded on the image. In FIG. 21, a slice from the experiment is shown. It can be seen that, the region at the center that shows the occipital lobe and the cerebellum are free from any folding artifacts. The total scan time is reduced by approximately 60%, using the proposed method.

Exemplary Apparatus

Figure 22:
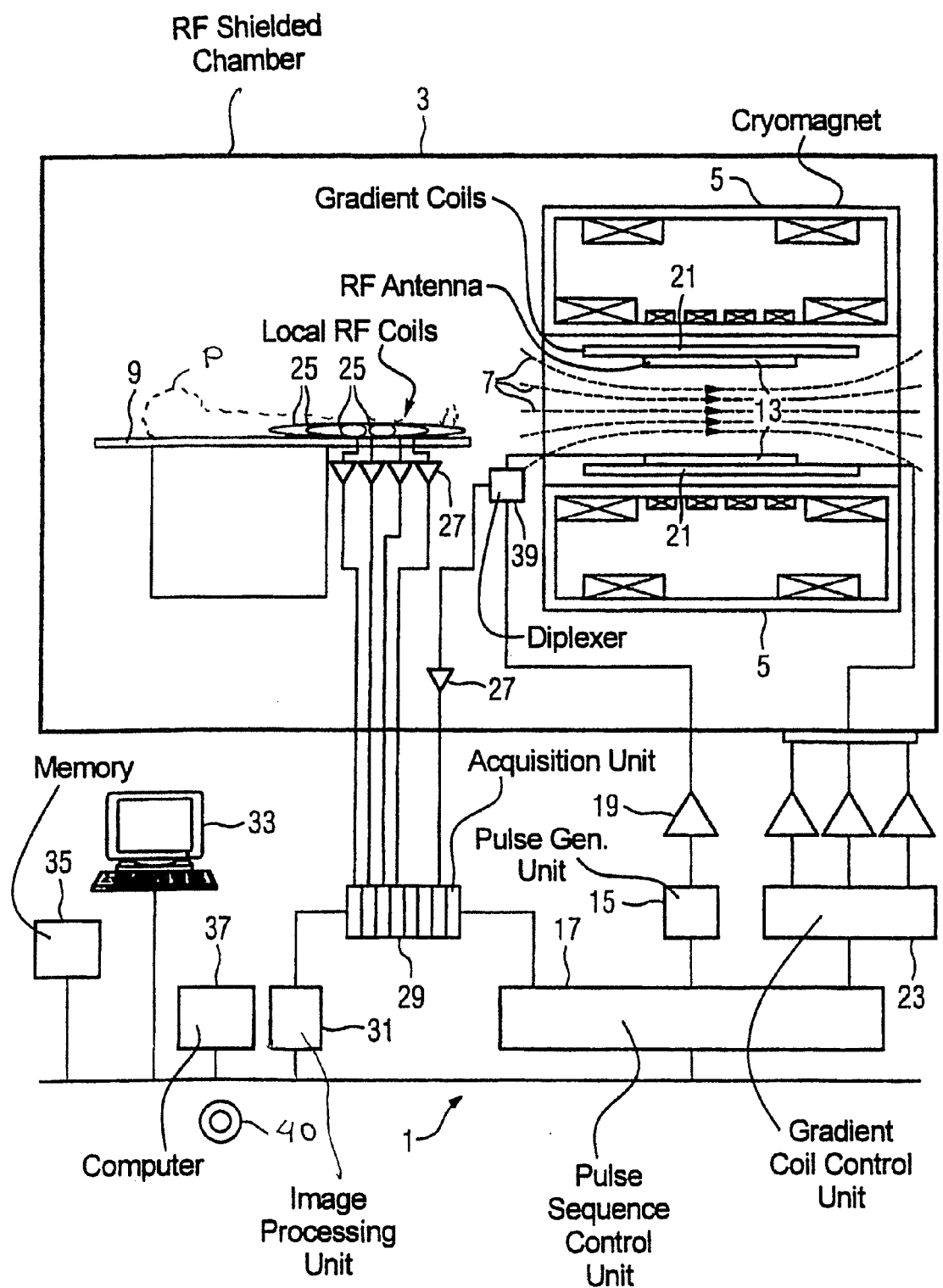
FIG. 22 schematically illustrates the basic components of a magnetic resonance apparatus for implementing the present invention.

FIG. 22 schematically shows the design of a magnetic resonance apparatus 1 with its basic components. In order to examine a body by means of magnetic resonance imaging, various magnetic fields tuned as precisely as possible to one another in terms of their temporal and spatial characteristics are radiated towards the body.

A strong magnet—typically a cryomagnet 5 with a tunnel-shaped opening—arranged in a radio frequency-shielded measurement chamber 3 generates a static, strong basic magnetic field 7 that typically amounts to 0.2 Tesla to 7 Tesla or more. An examination subject, a body or a body part to be examined (here represented as a patient P) is borne on a patient bed 9 that can be moved continuously through the measurement volume of the magnetic resonance apparatus and is driven in the homogeneous region of the basic magnetic field 7 (measurement volume).

The excitation of the nuclear spins of the body takes place via magnetic radio-frequency pulses (RF pulses) that are radiated via a radio-frequency antenna (shown here as a body coil 13). The radio-frequency excitation pulses are generated by a pulse generation unit 15 that is controlled by a pulse sequence control unit 17. After an amplification by a radio-frequency amplifier 19, they are directed to the radio-frequency antenna. The radio-frequency system shown here is merely schematically indicated. Typically, more than one pulse generation unit 15, more than one radio-frequency amplifier 19 and multiple radio-frequency antennas are used in a magnetic resonance apparatus 1.

Furthermore, the magnetic resonance apparatus 1 possesses gradient coils 21 with which magnetic gradient fields are radiated in a measurement, for example for selective slice excitation and for spatial coding of the measurement signal. The gradient coils 21 are controlled by a gradient coil control unit 23 that—like the pulse generation unit 15—is connected with the pulse sequence control unit 17. The pulse sequence control unit 17 is designed such that a pulse sequence according to the invention can be generated.

The signals emitted by the excited nuclear spins are received by the body coil 13 and/or by local coils 25, amplified by associated radio-frequency preamplifiers 27, and additionally processed and digitized by a receiver unit 29.

Given a coil that can be operated both in transmission mode and in reception mode—for example the body coil 13—the correct signal relaying is regulated by an upstream transmission/reception diplexer 39.

An image processing unit 31 generates from the measurement data an image that is presented to a user via a control console 33 or is stored in a memory unit 35. A central computer 37 controls the individual system components, in particular during the acquisition of the measurement data. The central computer 37 is designed such that a movement of the patient bed 9 and pulse sequences according to the present invention can be implemented, and a method according to the invention is implementable. For example, for this a computer program product according to the invention is loaded on or included in the computer 37 so as to be executable. The computer program product can be stored on an electronically readable data medium—a DVD 40, for example—so that this computer program product can then be read from the DVD 40 by the central computer 37 and be executed.

Limitations and Application to Transmit Arrays

It should be noted that slice selection with a rectangular pulse is limited with two of the main parameters of an MRI experiment, namely the slice thickness and the slice position. First, to be able to alter the position of the slice, additional field distributions are needed. As an example, if the field distributions used for slice selection is proportional to $z^3$, then $z^2$, $z$ and $z^0$ fields are also required to get a shift in the slice, i.e., produce $(z-z_0)^3$. For this example, the only additional field required is $z^2$ as $z$ coil already exists in the system and $z^0$ is a change in the RF carrier frequency.

Second, to change the slice thickness in the presence of a polynomial field distribution like $z^3$, changing the slope of the field, or the duration of the RF envelope is sufficient. However, to alter the slice thickness in the presence of a more complex distribution, it may be necessary to change the coil geometry/current distribution.

An alternative solution to both slice thickness and slice location problems would be usage of multiple coils with separate amplifiers. With such an array, it would be possible to adjust the currents on the coils and therefore change slice thickness and position. Furthermore, with such an array, oblique slice selection can be performed. A detailed discussion on gradient arrays can be found at (Juchem C, Nixon T W, McIntyre S, Rothman D L, de Graaf R A, Magnetic field modeling with a set of individual localized coils. J Magn Reson, 2010; 204:281-289).

Although transmit array systems have been used for parallel excitation for some years, their usage for parallel gradient arrays have been limited. However, each extra RF transmit channel paves the way for three additional gradient channels. Hence, multiple gradient waveforms can be applied to a set of gradient coils. A study for phase and frequency encoding using additional gradient channels can be found at (Gallichan D, Cocosco C A, Dewdney A, Schultz G, Welz A M, Hennig J, Zaitsev M, Simultaneously Driven Linear and Nonlinear Spatial Encoding Fields in MRI. Magn Reson Med, 2011; 65:702-714).

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) data from an examination subject, comprising:

placing an examination subject in an MR data acquisition unit;

operating the MR data acquisition unit with a pulse sequence protocol configured to acquire MR data from a slice of an examination subject within a volume of the MR data acquisition unit defined by spatial coordinates, said pulse sequence protocol comprising at least one defined radio-frequency (RF) pulse that causes radiation into said slice of a radiated RF pulse, said defined RF excitation pulse having a frequency spectrum and a slice profile with a relationship between said frequency spectrum and said slice profile; and substantially simultaneously with radiation of said radiated RF pulse, exposing said examination subject in said MR data acquisition unit to at least one non-linear magnetic field that is non-linear with respect to said spatial coordinates and, with said at least one non-linear magnetic field, altering said relationship in said radiated RF pulse between said frequency spectrum and said slice profile with respect to said relationship in said defined RF pulse.

2. A method as claimed in claim 1 comprising altering said relationship to decrease a specific absorption ratio (SAR) in said examination subject produced by said radiated RF excitation pulse.

3. A method as claimed in claim 1 comprising altering said relationship by altering the slice profile.

4. A method as claimed in claim 1 comprising altering said relationship to simultaneously decrease a specific absorption ratio (SAR) in said examination subject produced by said radiated RF excitation pulse and said slice profile.

5. A method as claimed in claim 1 comprising operating said MR data acquisition unit with a gradient echo imaging protocol as said pulse sequence protocol.

6. A method as claimed in claim 1 comprising operating said MR data acquisition unit with a spin echo imaging protocol as said pulse sequence protocol, that causes radiation of at least one radiated RF excitation pulse and at least one RF refocusing pulse into said slice of said examination subject, and exposing said examination subject to said at least one non-linear magnetic field substantially simultaneously only with radiation of said at least one radiated RF excitation pulse.

7. A method as claimed in claim 1 comprising operating said MR data acquisition unit with a spin echo imaging protocol as said pulse sequence protocol, that causes radiation of at least one radiated RF excitation pulse and at least one RF refocusing pulse into said slice of said examination subject, and exposing said examination subject to said at least one non-linear magnetic field substantially simultaneously only with radiation of said at least one radiated RF refocusing pulse.

8. A method as claimed in claim 1 comprising operating said MR data acquisition unit with a spin echo imaging protocol as said pulse sequence protocol, to cause radiation of at least one radiated RF excitation pulse and at least one radiated RF refocusing pulse into said slice of said examination subject, and applying said at least one non-linear magnetic field substantially simultaneously with each of said at least one radiated RF excitation pulse and each of said at least one radiated RF refocusing pulse.

9. A method as claimed in claim 1 comprising operating said MR image acquisition unit with said pulse sequence protocol to acquire magnetic resonance data from a slab of said examination subject, comprised of multiple slices.

10. A method as claimed in claim 9 comprising acquiring said MR data from each of multiple echoes resulting from radiation into said slab of said radiated RF pulse.

11. A method as claimed in claim 1 wherein nonlinear gradient fields are used for reducing the field-of-view.

12. A method as claimed in claim 1 wherein nonlinear gradient fields are used for reducing the total scan time.

13. A method as claimed in claim 1 comprising radiating said radiated RF pulse as a multi-dimensional radiated RF excitation pulse.

14. A method as claimed in claim 13 comprising configuring said radiated multi-dimensional excitation pulse to additionally alter said slice profile.

15. A method as claimed in claim 1 comprising further altering a specific absorption rate (SAR) produced by said radiated RF pulse in said slice using a variable-rate selective excitation technique.

16. A method as claimed in claim 1 wherein said radiated RF pulse has a radiated RF field distribution associated therewith that exhibits inhomogeneities, and correcting said inhomogeneities by altering said relationship using said at least one non-linear magnetic field.

17. A method as claimed in claim 1 wherein said radiated RF pulse is a radiated RF excitation pulse that excites nuclear spins in said slices in said examination subject, and comprising exciting nuclear spins in a curved region in said examination subject by exposing said examination subject to said at least one non-linear magnetic field.

18. A method as claimed in claim 1 wherein continuous RF transmission and reception are used.

19. A method as claimed in claim 1 wherein travelling electromagnetic waves are used for imaging.

20. A magnetic resonance (MR) imaging apparatus for acquiring MR data from an examination subject, comprising:

an MR data acquisition unit configured to receive an examination subject therein, said MR data acquisition unit comprising a radio frequency (RF) radiator and a magnetic coil system;

a control unit configured to operate the MR data acquisition unit with a pulse sequence protocol to acquire MR data from a slice of an examination subject within a volume of the MR data acquisition unit defined by spatial coordinates, said pulse sequence protocol comprising at least one defined RF pulse that causes radiation into said slice of a radiated RF pulse by said RF radiator, said defined RF excitation pulse having a frequency spectrum and a slice profile with a relationship between said frequency spectrum and said slice profile; and said control unit, according to said pulse sequence protocol, being configured to operate said magnetic coil system to, substantially simultaneously with radiation of said radiated RF pulse, expose said examination subject in said MR data acquisition unit to at least one non-linear magnetic field that is non-linear with respect to said spatial coordinates and, with said at least one non-linear magnetic field, alter said relationship in said radiated RF pulse between said frequency spectrum and said slice profile with respect to said relationship in said defined RF pulse.

21. A non-transitory, computer-readable data storage medium encoded with programming instructions, said data storage medium being loaded into a computerized control unit of a magnetic resonance (MR) data acquisition unit in which an examination subject is placed and that comprises a radio frequency (RF) radiator and a magnetic coil system, and said programming instructions causing said computerized control unit to:

operate the MR data acquisition unit with a pulse sequence protocol configured to acquire MR data from a slice of an examination subject within a volume of the MR data acquisition unit defined by spatial coordinates, said pulse sequence protocol comprising at least one defined RF pulse that causes radiation into said slice of a radiated RF pulse by said RF radiator, said defined RF excitation pulse having a frequency spectrum and a slice profile with a relationship between said frequency spectrum and said slice profile; and substantially simultaneously with radiation of said radiated RF pulse, operate said magnetic coil system to expose said examination subject in said MR data acquisition unit to at least one non-linear magnetic field that is non-linear with respect to said spatial coordinates and, with said at least one non-linear magnetic field, alter said relationship in said radiated RF pulse between said frequency spectrum and said slice profile with respect to said relationship in said defined RF pulse.

* * * * *